US010476525B2

(12) United States Patent
Sarkis et al.

(10) Patent No.: US 10,476,525 B2
(45) Date of Patent: Nov. 12, 2019

(54) LOW LATENCY BIT-REVERSED POLAR CODES

(71) Applicant: QUALCOMM Incorporated, San Diego, CA (US)

(72) Inventors: Gabi Sarkis, San Diego, CA (US); Hari Sankar, San Diego, CA (US); Vincent Loncke, Piscataway, NJ (US); Joseph Binamira Soriaga, San Diego, CA (US); Yang Yang, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/704,204

(22) Filed: Sep. 14, 2017

(65) Prior Publication Data

US 2018/0198469 A1 Jul. 12, 2018

Related U.S. Application Data

(60) Provisional application No. 62/444,261, filed on Jan. 9, 2017.

(51) Int. Cl.
H03M 13/00 (2006.01)
H03M 13/15 (2006.01)
(Continued)

(52) U.S. Cl.
CPC ...... *H03M 13/1595* (2013.01); *G06F 17/156* (2013.01); *H03M 13/1125* (2013.01);
(Continued)

(58) Field of Classification Search
None
See application file for complete search history.

(56) References Cited

U.S. PATENT DOCUMENTS 6,105,158 A * 8/2000 Chen ............. H03M 13/09
714/755
8,677,227 B2 * 3/2014 Gross ............ H03M 13/1117
714/807
(Continued)

OTHER PUBLICATIONS

Arikan E., "Channel Polarization: a Method for Constructing Capacity-Achieving Codes for Symmetric Binary-Input Memoryless Channels," IEEE Transactions on Information Theory, vol. 55 (7), 24 Jul. 2008, pp. 3051-3073, XP080428257.
(Continued)

Primary Examiner — Mujtaba M Chaudry
(74) Attorney, Agent, or Firm — Arent Fox LLP

(57) ABSTRACT

In an aspect of the disclosure, a method, a computer-readable medium, and an apparatus are provided. The apparatus may determine indices associated with m consecutive elements. In an aspect, each of the m consecutive elements may be associated with a different index. In addition, the apparatus may bit reverse a binary sequence associated with each of the m consecutive elements. In an aspect, each of the m consecutive elements may include a different binary sequence. Further, the apparatus may determine a bit-reversed order of the indices based at least in part on the bit-reversed binary sequence associated with each of the m elements. In addition, the apparatus may write each of the m consecutive elements to a different memory bank in parallel based at least in part on the bit-reversed order of the indices.

19 Claims, 23 Drawing Sheets

(51) Int. Cl.
  *H03M 13/19* (2006.01)
  *G06F 17/15* (2006.01)
  *H03M 13/11* (2006.01)
  *H03M 13/13* (2006.01)
  *G06F 17/16* (2006.01)
  *G06F 16/901* (2019.01)

(52) U.S. Cl.
  CPC ........... *H03M 13/13* (2013.01); *H03M 13/19* (2013.01); *H03M 13/611* (2013.01); *H03M 13/6561* (2013.01); *G06F 16/9024* (2019.01); *G06F 17/16* (2013.01); *H03M 13/617* (2013.01)

(56) References Cited

U.S. PATENT DOCUMENTS

| | | | | |
|---|---|---|---|---|
| 2012/0054576 A1* | 3/2012 | Gross | ................ | H03M 13/1117 714/752 |
| 2013/0117344 A1 | 5/2013 | Gross et al. | | |
| 2014/0019820 A1* | 1/2014 | Vardy | ................. | H03M 13/13 714/752 |
| 2014/0089370 A1* | 3/2014 | Xie | ....................... | G06F 17/142 708/409 |
| 2015/0077277 A1* | 3/2015 | Alhussien | ........... | H03M 13/618 341/67 |
| 2015/0229337 A1* | 8/2015 | Alhussien | ............. | H03M 13/35 714/773 |
| 2015/0333769 A1* | 11/2015 | Jeong | ................ | H03M 13/6362 714/790 |
| 2018/0076831 A1* | 3/2018 | Hamelin | ............... | H03M 13/13 |

OTHER PUBLICATIONS

International Search Report and Written Opinion—PCT/US2017/068664—ISA/EPO—dated Apr. 11, 2018.
Le Gal B., et al: "A Scalable 3-Phase Polar Decoder", IEEE International Symposium on Circuits and Systems (ISCAS), IEEE, May 22, 2016, pp. 417-420, XP032941568, DOI: 10.1109/ISCAS.2016.7527259.
Vangala H., et al., "A New Multiple Folded Successive Cancellation Decoder for Polar Codes", IEEE Information Theory Workshop, ITW 2014, Nov. 2, 2014, pp. 381-385, XP032694569, ISSN: 1662-9019, DOI: 10.1109/ITW.2014.6970858.

* cited by examiner

LOW LATENCY BIT-REVERSED POLAR CODES

CROSS-REFERENCE TO RELATED APPLICATION

This application claims the benefit of U.S. Provisional Application Ser. No. 62/444,261, entitled "LOW LATENCY BIT-REVERSED POLAR CODES" and filed on Jan. 9, 2017, which is expressly incorporated by reference herein in its entirety.

BACKGROUND

Field

The present disclosure relates generally to communication systems, and more particularly, to performing semi-parallel and/or parallel bit-reversal at a polar encoder and/or polar decoder.

Background

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is Long Term Evolution (LTE). LTE is a set of enhancements to the Universal Mobile Telecommunications System (UMTS) mobile standard promulgated by Third Generation Partnership Project (3GPP). LTE is designed to support mobile broadband access through improved spectral efficiency, lowered costs, and improved services using OFDMA on the downlink, SC-FDMA on the uplink, and multiple-input multiple-output (MIMO) antenna technology. However, as the demand for mobile broadband access continues to increase, there exists a need for further improvements in LTE technology. These improvements may also be applicable to other multi-access technologies and the telecommunication standards that employ these technologies.

Message encoding may be used in various communication systems (e.g., millimeter-wave (mmW) communication systems) so that errors in a received message may be corrected and/or detected by the decoder of a receiver device. Linear block codes are a type of error-correcting codes that may be used by an mmW communications system to encode data in blocks. One class of linear block codes are polar codes.

Polar decoding is conventionally performed using a serial cancellation decoding algorithm. The serial cancellation decoding algorithm may perform a soft estimation of the original information encoded by the transmitter device. In general, due to the inherent data dependencies in the serial cancellation decoding algorithm, parallelization may not be exploited in implementing the algorithm. As a result, a polar encoder and/or polar decoder may suffer from low coding/decoding throughput and high latency. There is a need for a polar encoding and/or polar decoding technique that provides lower latency.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Data encoding may be used in various communication systems (e.g., mmW communication systems) so that errors in the received message may be corrected and/or detected by the decoder of a receiver device. Linear block codes are a type of error-correcting codes that may be used by an mmW communication system to encode data in blocks. One class of linear block codes are polar codes.

Polar decoding is conventionally performed using a serial cancellation decoding algorithm. The serial cancellation decoding algorithm may perform a soft estimation of the original information encoded by the transmitter device. In general, due to the inherent data dependencies in the serial cancellation decoding algorithm, parallelization may not be exploited in implementing the algorithm. As a result, a polar encoder and/or polar decoder may suffer from low coding/decoding throughput and high latency. There is a need for a polar encoding/decoding technique that provides lower latency.

The present disclosure provides a solution by enabling a semi-parallel bit-reversal technique at the polar encoder of a transmitter device and/or the polar decoder of a receiver device such that the latency associated with the serial cancellation decoding algorithm of conventional polar encoding and/or polar decoding techniques may be reduced.

In an aspect of the disclosure, a method, a computer-readable medium, and an apparatus are provided. The apparatus may determine indices associated with m consecutive elements. In an aspect, each of the m consecutive elements may be associated with a different index. In addition, the apparatus may bit reverse a different binary sequence associated with each of the m consecutive elements. Further, the apparatus may determine a bit-reversed order of the indices based at least in part on the bit-reversed binary sequence associated with each of the m elements. In addition, the apparatus may write each of the m consecutive elements to a different memory bank in parallel based at least in part on the bit-reversed order of the indices.

The apparatus may determine indices associated with m consecutive elements. In an aspect, each of the m consecutive elements may be associated with a different index. In another aspect, each of the m consecutive elements may include at least in part k information bits. In a further aspect, the apparatus may determine a permutation matrix. Further, the apparatus may permute the k information bits. In addition, the apparatus may form a vector by applying a reversed expansion matrix to the k information bits to include additional bits in bit-reversed predetermined locations. In an aspect, the vector may include N bits. Additionally, the apparatus may apply a non-reversed encoding matrix to obtain a signal for transmission.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
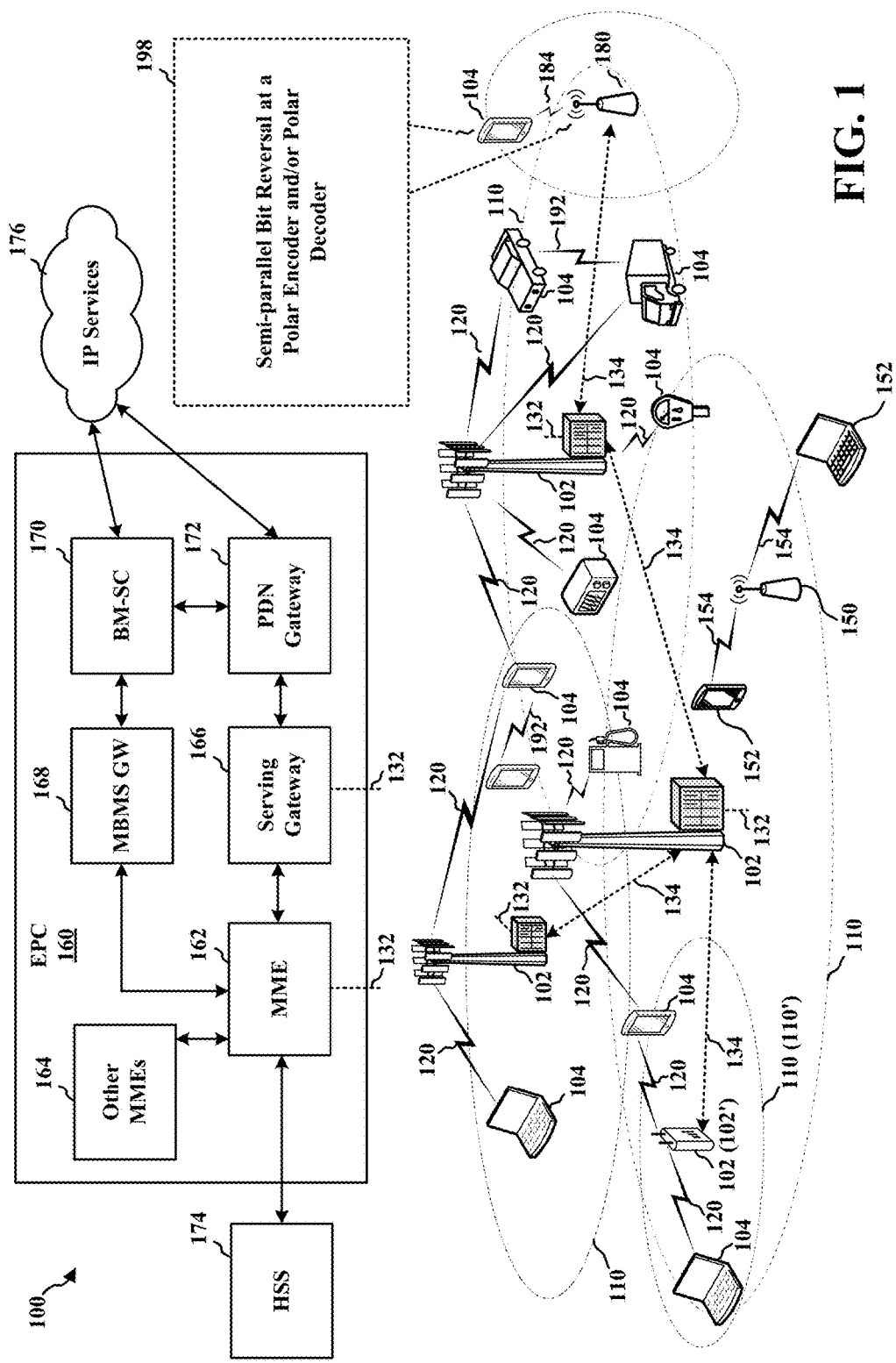
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include eNBs. The small cells include femtocells, picocells, and microcells.

The base stations 102 (collectively referred to as Evolved Universal Mobile Telecommunications System (UMTS) Terrestrial Radio Access Network (E-UTRAN)) interface with the EPC 160 through backhaul links 132 (e.g., S1 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use MIMO antenna technology, including spatial multiplexing, beamforming, and/or transmit diversity. The communication links may be through one or more carriers. The base stations 102/UEs 104 may use spectrum up to Y MHz (e.g., 5, 10, 15, 20 MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ LTE and use the same 5 GHz unlicensed frequency spectrum as used by the Wi-Fi AP 150. The small cell 102', employing LTE in an unlicensed frequency spectrum, may boost coverage to and/or increase capacity of the access network. LTE in an unlicensed spectrum may be referred to as LTE-unlicensed (LTE-U), licensed assisted access (LAA), or MuLTEfire.

The mmW base station 180 may operate in mmW frequencies and/or near mmW frequencies in communication with the UE 182. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 184 with the UE 182 to compensate for the extremely high path loss and short range.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service (PSS), and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a Node B, evolved Node B (eNB), an access point, a base transceiver station, a radio base station, a radio transceiver, a transceiver function, a basic service set (BSS), an extended service set (ESS), or some other suitable terminology. The base station 102 provides an access point to the EPC 160 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, or any other similar functioning device. The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, the UE 104 and/or mmW base station 180 may be configured to perform semi-parallel bit-reversal at a polar encoder and/or polar decoder (198).

Figures 2A, 2B, 2C, 2D:
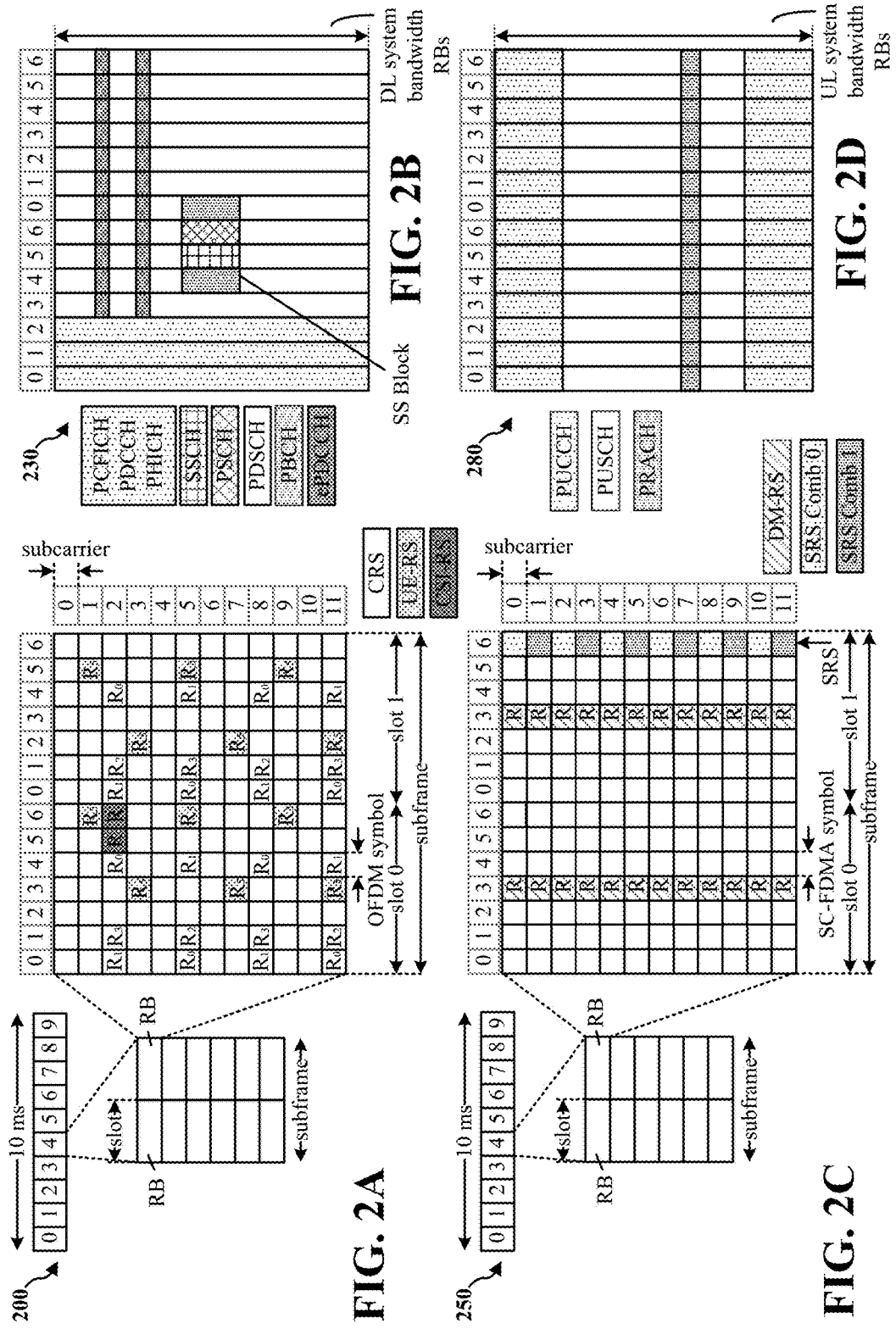
FIGS. 2A, 2B, 2C, and 2D are diagrams illustrating LTE examples of a DL frame structure, DL channels within the DL frame structure, an UL frame structure, and UL channels within the UL frame structure, respectively.

FIG. 2A is a diagram 200 illustrating an example of a DL frame structure in LTE. FIG. 2B is a diagram 230 illustrating an example of channels within the DL frame structure in LTE. FIG. 2C is a diagram 250 illustrating an example of an UL frame structure in LTE. FIG. 2D is a diagram 280 illustrating an example of channels within the UL frame structure in LTE. Other wireless communication technologies may have a different frame structure and/or different channels. In LTE, a frame (10 ms) may be divided into 10 equally sized subframes. Each subframe may include two consecutive time slots. A resource grid may be used to represent the two time slots, each time slot including one or more time concurrent resource blocks (RBs) (also referred to as physical RBs (PRBs)). The resource grid is divided into multiple resource elements (REs). In LTE, for a normal cyclic prefix, an RB contains 12 consecutive subcarriers in the frequency domain and 7 consecutive symbols (for DL, OFDM symbols; for UL, SC-FDMA symbols) in the time domain, for a total of 84 REs. For an extended cyclic prefix, an RB contains 12 consecutive subcarriers in the frequency domain and 6 consecutive symbols in the time domain, for a total of 72 REs. The number of bits carried by each RE depends on the modulation scheme.

As illustrated in FIG. 2A, some of the REs carry DL reference (pilot) signals (DL-RS) for channel estimation at the UE. The DL-RS may include cell-specific reference signals (CRS) (also sometimes called common RS), UE-specific reference signals (UE-RS), and channel state information reference signals (CSI-RS). FIG. 2A illustrates CRS for antenna ports 0, 1, 2, and 3 (indicated as $R_0$, $R_1$, $R_2$, and $R_3$, respectively), UE-RS for antenna port 5 (indicated as $R_5$), and CSI-RS for antenna port 15 (indicated as R). FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARQ) indicator channel (PHICH) is also within symbol 0 of slot 0 and carries the HARQ indicator (HI) that indicates HARQ acknowledgement (ACK)/negative ACK (NACK) feedback based on the physical uplink shared channel (PUSCH). The primary synchronization channel (PSCH) is within symbol 6 of slot 0 within subframes 0 and 5 of a frame, and carries a primary synchronization signal (PSS) that is used by a UE to determine subframe timing and a physical layer identity. The secondary synchronization channel (SSCH) is within symbol 5 of slot 0 within subframes 0 and 5 of a frame, and carries a secondary synchronization signal (SSS) that is used by a UE to determine a physical layer cell identity group number. Based on the physical layer identity and the physical layer cell identity group number, the UE can determine a physical cell identifier (PCI). Based on the PCI, the UE can determine the locations of the aforementioned DL-RS. The physical broadcast channel (PBCH) is within symbols 0, 1, 2, 3 of slot 1 of subframe 0 of a frame, and carries a master information block (MIB). The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DM-RS) for channel estimation at the eNB. The UE may additionally transmit sounding reference signals (SRS) in the last symbol of a subframe. The SRS may have a comb structure, and a UE may transmit SRS on one of the combs. The SRS may be used by an eNB for channel quality estimation to enable frequency-dependent scheduling on the UL. FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
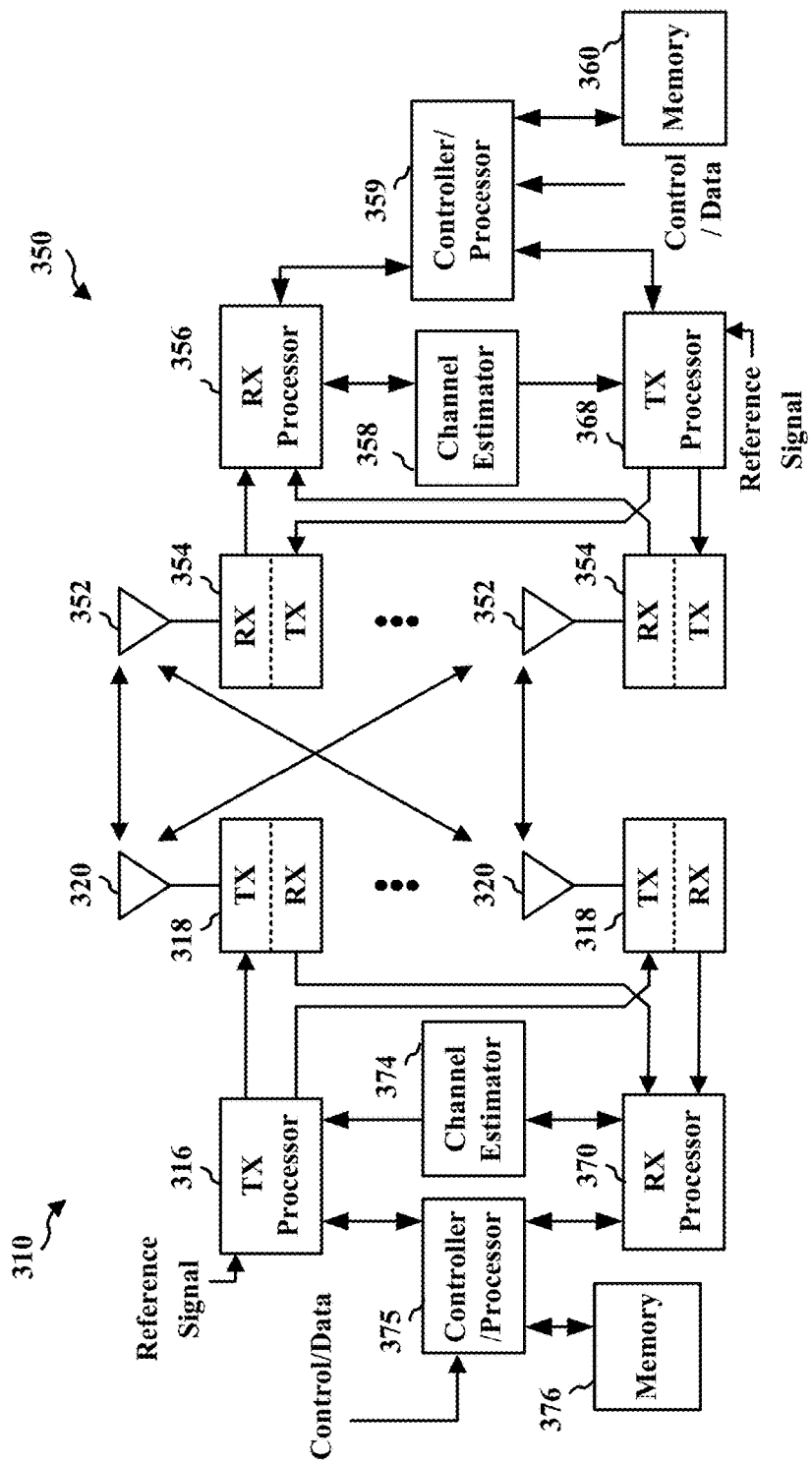
FIG. 3 is a diagram illustrating an example of an evolved Node B (eNB) and user equipment (UE) in an access network.

FIG. 3 is a block diagram of an eNB 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the eNB 310. These soft decisions may be based on channel estimates computed by the channel estimator 358. The soft decisions are then decoded and deinterleaved to recover the data and control signals that were originally transmitted by the eNB 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the eNB 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the eNB 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the eNB 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

Data encoding may be used in various communication systems (e.g., mmW communication systems) so that errors in a received message may be corrected and/or detected by the decoder of a receiver device. Linear block codes are a type of error-correcting codes that may be used to encode data in blocks.

One class of linear block codes are polar codes. Polar codes may generate data at a rate sufficient to transmit at channel capacity for symmetric binary-input discrete memoryless channels, and may be constructed on the basis of a probabilistic phenomenon referred to as "channel polarization." In general, channel polarization refers to the observation that as the code length N grows large for polar codes, the "channels" associated with individual bits in an information vector u may asymptotically approach either a pure-noise channel or a pure-noiseless channel. The fraction of channels that become noiseless may be equal to the capacity of the channel in the limit case. Polar codes may be constructed by identifying the indices of the bits in the information vector u that are associated with channels approaching noise free conditions and by using the identified indices (or some subset of the identified indices) to transmit information (e.g., tones and/or signals), while setting the remaining indices to predetermined values known by both the encoder and decoder.

For a linear block code, the codewords may be related to the message (e.g., tone and/or signals) that is transmitted using a linear transformation. Since the codewords may be longer than the messages, the matrix that represents the linear transformation may be rectangular. In order to simplify the analysis of a received codeword, the input message at the decoder may be padded with extra bits that are constant (e.g., "frozen bits") in order to make the matrix square.

Polar decoding is conventionally performed using a serial cancellation decoding algorithm. The serial cancellation decoding algorithm may perform a soft estimation of the original information vector u. In general, due to the inherent data dependencies in the serial cancellation decoding algorithm, parallelization may not be exploited in implementing the algorithm. As a result, a polar decoder may suffer from low decoding throughput and high latency. There is a need for a polar encoding/decoding technique that provides lower latency.

The present disclosure provides a solution by enabling a semi-parallel bit-reversal technique at the polar encoder of a transmitter device and/or the polar decoder of a receiver device such that the latency associated with the serial cancellation decoding algorithm of conventional polar encoding and/or polar decoding techniques may be reduced.

Bit-Reversal at Transmitter—First Example

Figure 4A:
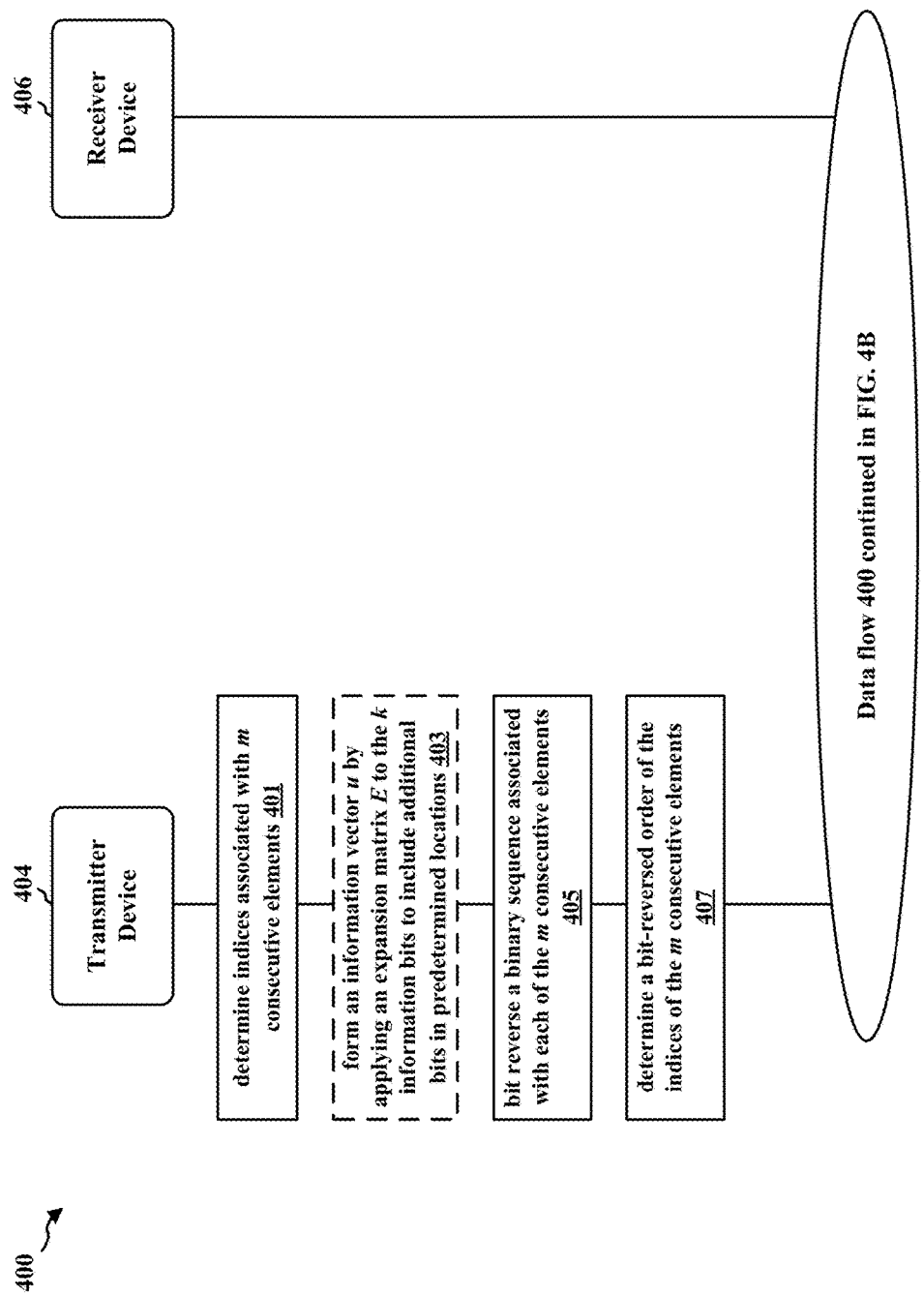
FIGS. 4A and 4B illustrate a data flow for a first example of performing polar encoding of a signal in accordance with certain aspects of the disclosure.
Figure 4B:
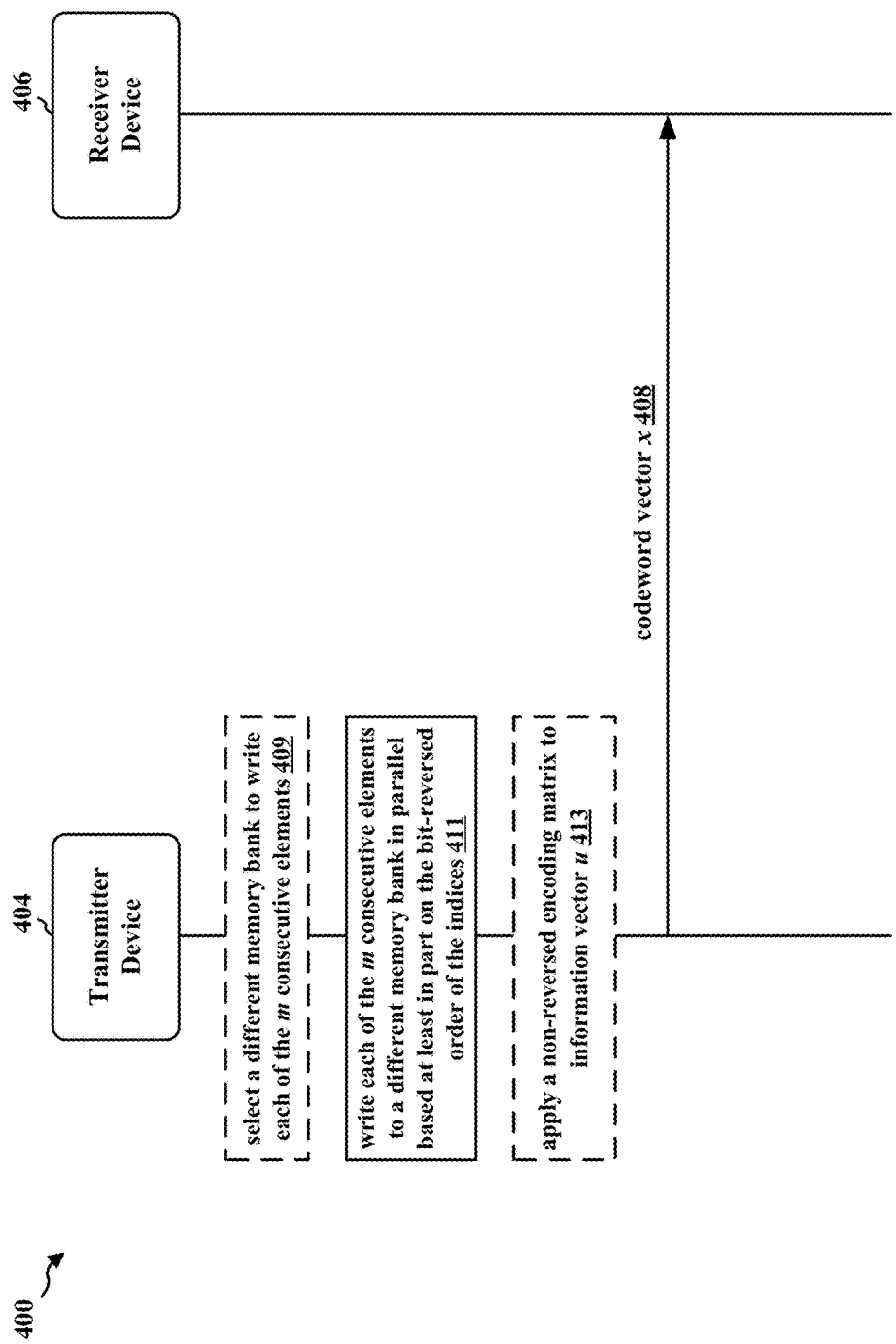

FIGS. 4A and 4B illustrate a data flow 400 for a first example of performing polar encoding of a signal that is transmitted from a transmitter device 404 to a receiver device 406 in accordance with certain aspects of the disclosure. The transmitter device 404 may correspond to, e.g., the base station 102, 180, the eNB 310, the UE 104, 182, 350, the transmitter device 1250, the apparatus 902/902', 1502/1502'. The receiver device 406 may correspond to, e.g., the base station 102, 180, the eNB 310, the UE 104, 182, 350, the receiver device 950, 1550, the apparatus 1202/1202'. In one configuration, the transmitter device 404 may be a base station, and the receiver device 406 may be a UE. In certain other configurations, the transmitter device 404 may be a UE, and the receiver device 406 may be a base station. In FIGS. 4A and 4B, optional operations are indicated with dashed lines.

Figure 5A:
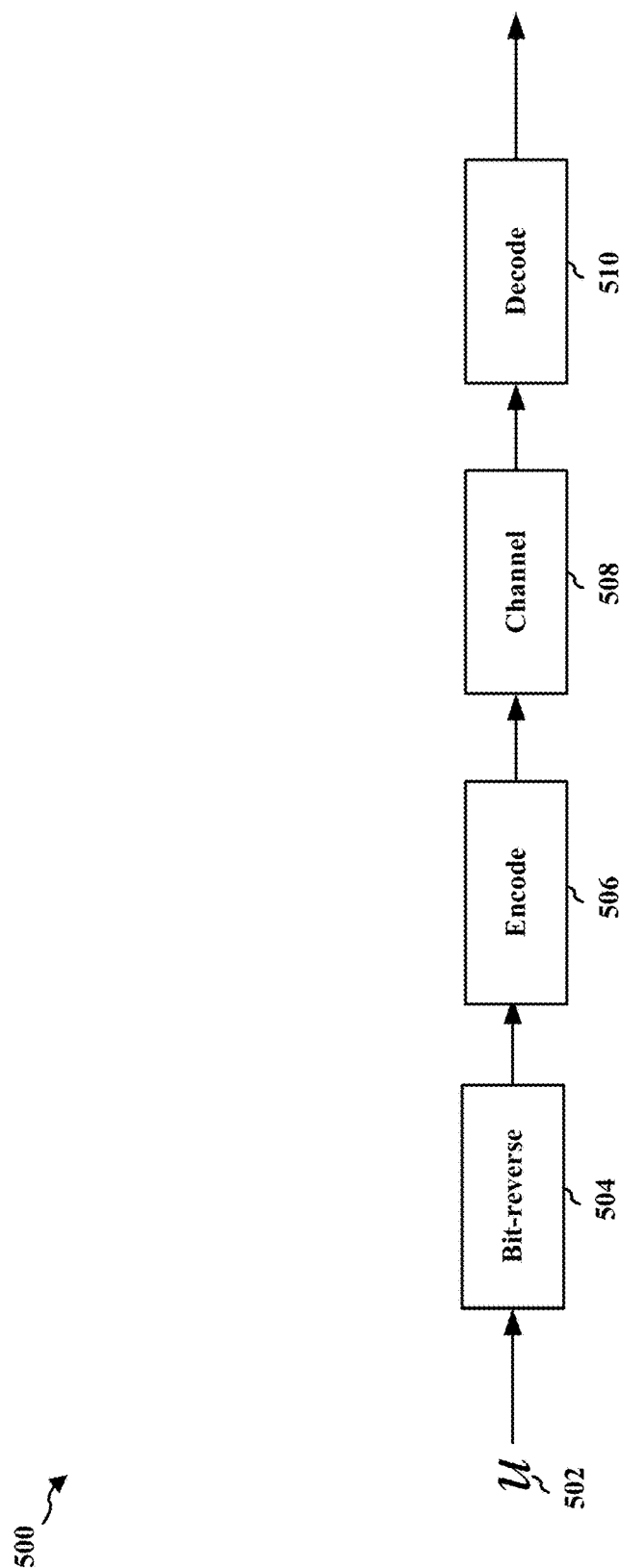
FIG. 5A is a diagram of a bit-reversal technique in accordance with one aspect of the present disclosure.
Figure 5B:
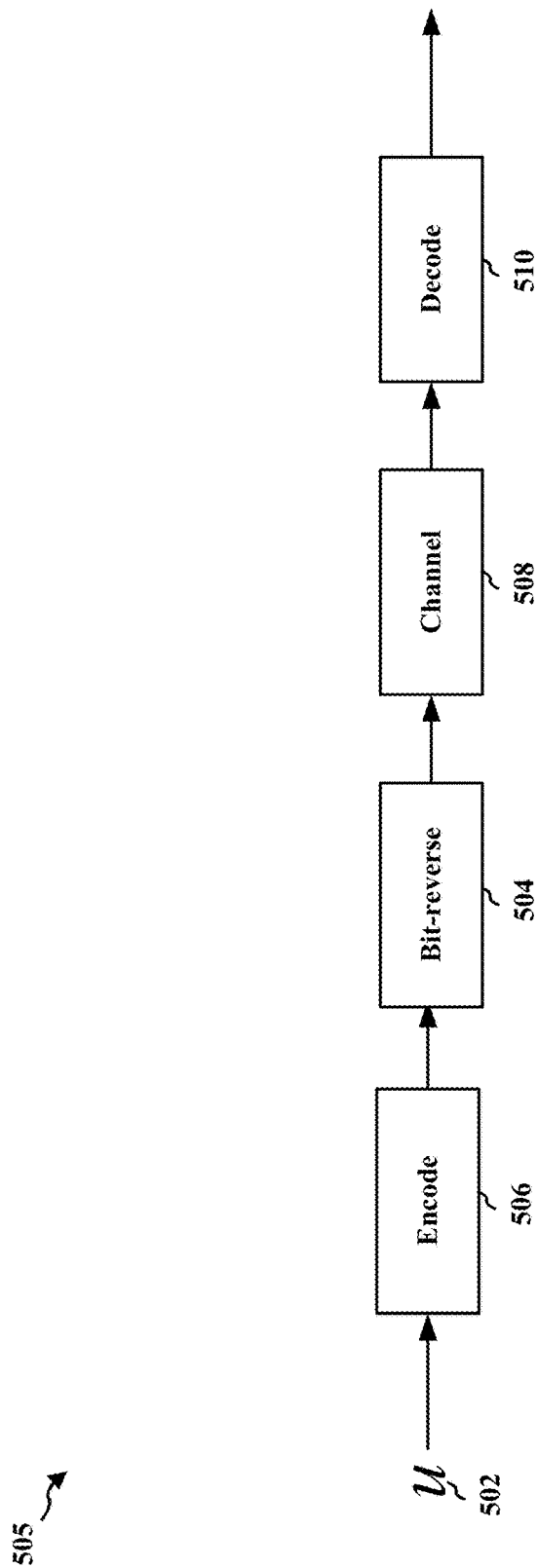
FIG. 5B is a diagram of a bit-reversal technique in accordance with one aspect of the present disclosure.
Figure 5C:
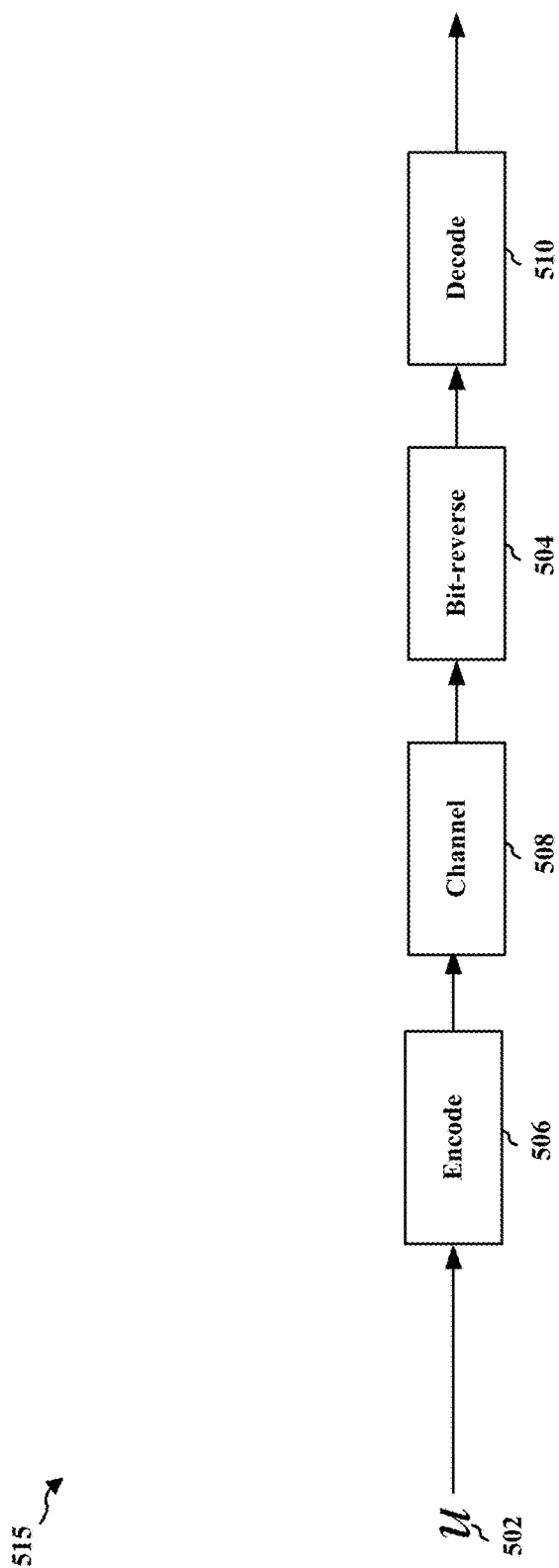
FIG. 5C is a diagram of a bit-reversal technique in accordance with one aspect of the present disclosure.

In an aspect, the transmitter device 404 may include a polar encoder (e.g., see FIGS. 5A-5C) and the receiver device 406 may include a polar decoder (e.g., see FIGS. 5A-5C). In one aspect, the polar encoder of the transmitter device 404 and/or the polar decoder of the receiver device 406 may perform semi-parallel and/or parallel bit-reversal technique such that the latency associated with the serial bit-reversal of conventional polar encoding and/or polar decoding may be reduced.

In certain configurations, the (N, k) polar code of the present disclosure may encode information bits $u_A$ (e.g., k number of bits) into a codeword vector x of length N. For example, the transmitter device 404 may obtain a codeword vector x by multiplying information bits/JA by an expansion matrix E to form an information vector u. The information vector u may be multiplied by a generator matrix $F^{\otimes \log_2 N}$ to obtain the codeword vector x. The codeword vector x may be transmitted to a receiver device 406 over a communication channel. A decoder at the receiver device 406 may receive a vector y that represents the codeword vector x with noise picked up during transmission on the communication channel. The decoder may process the vector y to produce an estimate $\hat{u}_A$ of the original information vector u.

Bit-reversal at the polar encoder and/or polar decoder may be implemented using a bit-reversal permutation matrix that permutes a sequence of m elements, where $m=2^k$. Bit reversal may be defined as indexing m consecutive elements in a sequence of elements from 0 to m−1 and then reversing binary sequences of each of the m consecutive elements. In other words, the most significant log 2(m) bit (e.g., leftmost bit) may become the least significant log 2(m) bit (e.g., rightmost bit), and vice versa after bit-reversal, and the least significant log 2(m) may become the most signification log 2(m) bit. Each of the m consecutive elements may be mapped to the new position given by the reordered indices of the m consecutive elements after bit-reversal. Bit reversal may increase the computational efficiency of radix-2 FFT algorithms, where the recursive stages of the algorithm, operating in-place, imply a bit reversal of the inputs or outputs at the decoder of the receiver device 406.

The transmitter device 404 may convert m consecutive elements into codeword vector x 408 (e.g., signals and/or tones) that are polar encoded and transmitted to the receiver device 406. Transmitter device 404 may determine 401 indices associated with m consecutive elements. In an aspect, each of the m consecutive elements may be associated with a different index (e.g., 0 to m−1), and each of the m consecutive elements may include at least in part k information bits.

The transmitter device 404 may form 403 an information vector u by applying an expansion matrix E to the k information bits (of each of the m consecutive elements) to include additional bits in predetermined locations. For example, the additional bits may be j frozen bits (e.g., 0s inserted at predetermined locations in each element). In an aspect, the information vector u may include N bits (e.g., (k information bits)+(j frozen bits)=N bits of the information vector u).

In addition, the transmitter device 404 may bit reverse 405 a binary sequence associated with each of the m consecutive elements. For example, the transmitter device 404 may bit reverse 405 the binary sequence associated with each of the m consecutive elements by applying a bit-reversal permutation matrix B to the information vector u. In an aspect, the binary sequence associated with each of the m consecutive elements may have a different log 2(m) least significant bit.

In an aspect, each of the m consecutive elements may include a different binary sequence. Assuming m=4, the information vector u may include a four-element sequence $u_0, u_1, u_2, u_3$. By way of example, the first element $u_0$ may have an original binary sequence of 00, the second element $u_1$ may have an original binary sequence of 01, the third element $u_2$ may have an original binary sequence of 10, and the fourth element $u_3$ may have an original binary sequence of 11. That is, the binary sequence associated with index 0 in information vector u (e.g., $u_0$) may be 00, the binary sequence associated with index 1 in information vector u (e.g., $u_1$) may be 01, the binary sequence associated with index 2 in information vector u (e.g., $u_2$) may be 10, and the binary sequence associated with index 3 in information vector u (e.g., $u_3$) may be 11.

After bit-reversal, the first element $u_0$ may still have a binary sequence of 00, a second element $u_1$ may have a bit-reversed binary sequence of 10, a third element $u_2$ may have a non-bit reversed binary sequence of 01, and the fourth element $u_3$ may still have a binary sequence of 11.

Each of the m consecutive elements may have a different most significant log 2(m) bit after the binary sequence is bit-reversed. Based at least in part on the bit-reversed binary sequence associated with each of the m elements, the transmitter device 404 may determine 407 a bit-reversed order of the indices of the m consecutive elements. For example, the bit-reversed order of the indices of the four-element sequence described above may be $u_0$, $u_2$, $u_1$, $u_3$.

Referring to FIG. 4B, the transmitter device 404 may use the most significant log 2(m) bit to select 409 a different memory (e.g., a memory bank) to write each of the m consecutive elements. By way of example, and not limitation, the memory bank may comprise a RAM, a ROM, an EEPROM, optical disk storage, magnetic disk storage, other magnetic storage devices, combinations of the aforementioned types of memory banks, or any other medium that can be used to store the m consecutive elements. Additional details associated with the memory bank selection technique using the most significant log 2(m) bit after determining 407 the bit-reversed order of the indices are described below with reference to FIG. 7.

In one aspect, the transmitter device 404 may write 411 each of the m consecutive elements to a different memory bank in parallel (e.g., concurrently) based at least in part on the bit-reversed order of the indices.

To obtain the codeword vector x 408 (e.g., x=$u_4$EBF) for transmission, transmitter device 404 may apply 413 a non-reversed encoding matrix $F^{\otimes \, log \, 2N}$ to information vector u. In an aspect, $$F = \begin{bmatrix} 1 & 0 \\ 1 & 1 \end{bmatrix}.$$

In one configuration, transmitter device 404 may apply 413 the non-reversed encoding matrix $F^{\otimes \, log \, 2N}$ before the bit-reversal permutation matrix B is applied to the information vector u, as discussed infra with respect to FIG. 5A. In another configuration, transmitter device 404 may apply 413 the non-reversed encoding matrix $F^{\otimes \, log \, 2N}$ after the bit-reversal permutation matrix B is applied to the information vector u, as discussed infra with respect to FIG. 5B.

Figure 6A:
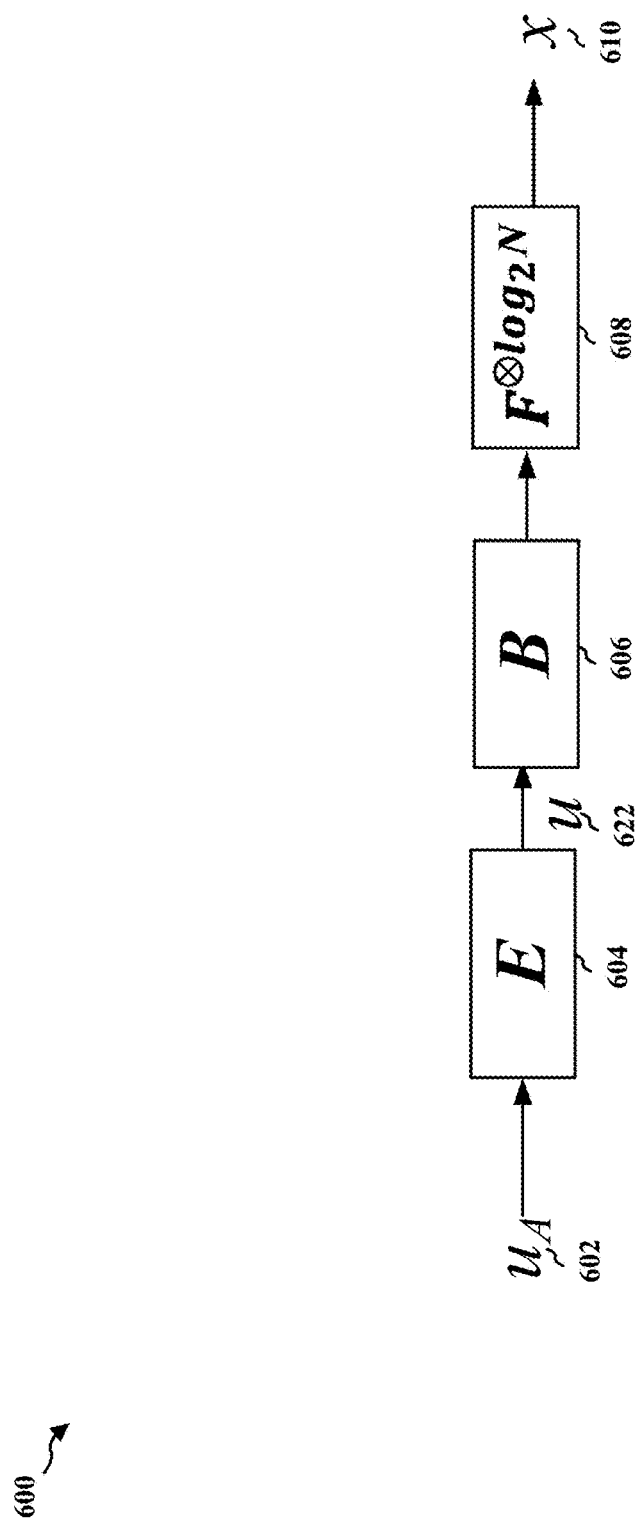
FIG. 6A is a diagram of a bit-reversal technique in accordance with one aspect of the present disclosure.

An illustration of the bit-reversal technique described above with reference to FIGS. 4A and 4B can be seen in FIG. 6A.

Bit-Reversal at Transmitter—Second Example

Figure 4C:
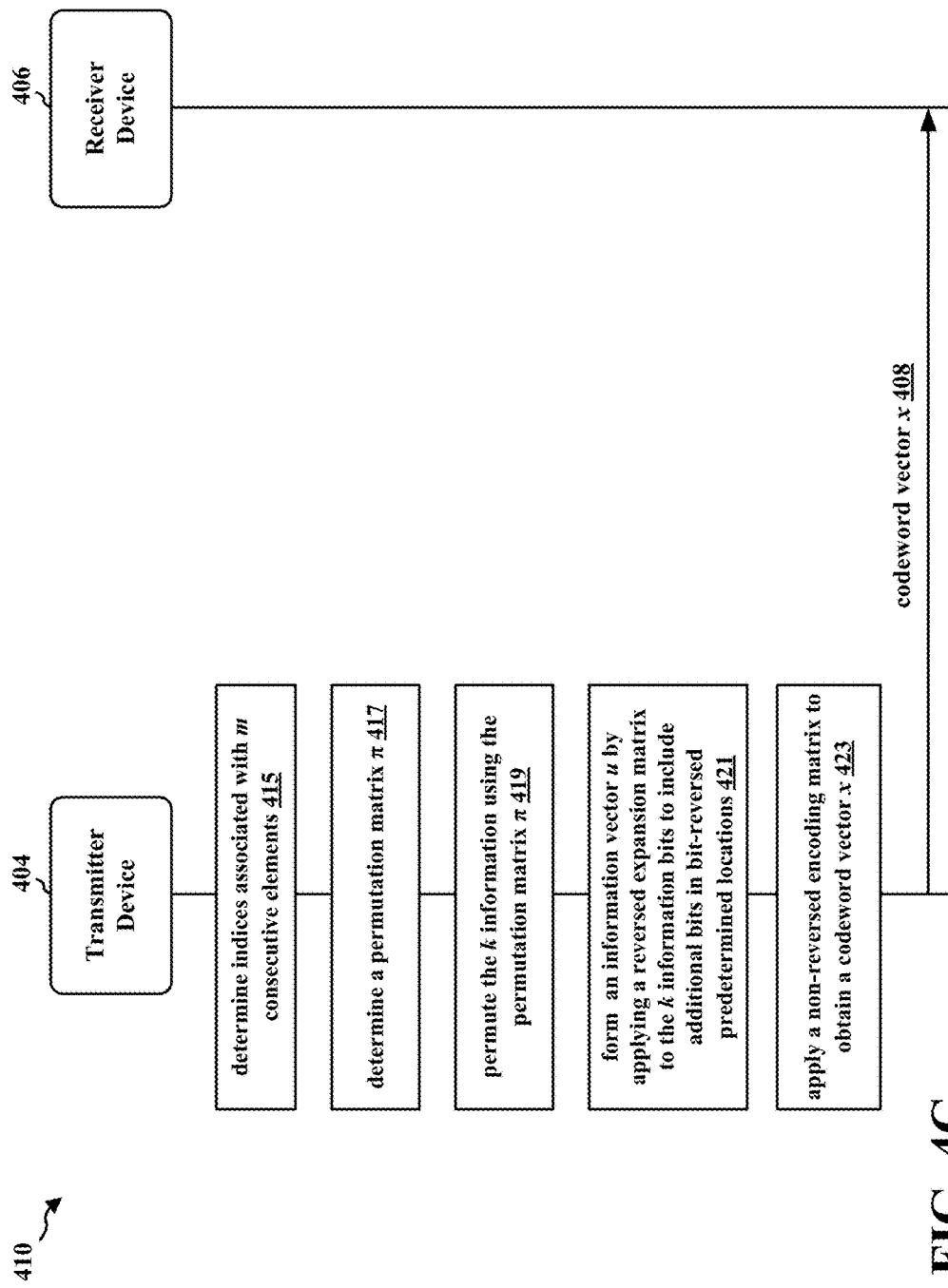
FIG. 4C illustrate a data flow for a second example of performing polar encoding of a signal in accordance with certain aspects of the disclosure.

FIG. 4C illustrates a data flow 410 for a second example of performing polar encoding of a signal that is transmitted from a transmitter device 404 to a receiver device 406 in accordance with certain aspects of the disclosure. The transmitter device 404 may correspond to, e.g., the base station 102, 180, the eNB 310, the UE 104, 182, 350, the transmitter device 1250, the apparatus 902/902', 1502/1502'. The receiver device 406 may correspond to, e.g., the base station 102, 180, the eNB 310, the UE 104, 182, 350, the receiver device 950, 1550, the apparatus 1202/1202'. In one configuration, the transmitter device 404 may be a base station, and the receiver device 406 may be a UE. In certain other configurations, the transmitter device 404 may be a UE, and the receiver device 406 may be a base station.

Referring to FIG. 4C, the transmitter device 404 may determine 415 indices associated with m consecutive elements. In an aspect, each of the m consecutive elements may be associated with a different index. In another aspect, each of the m consecutive elements may include at least in part k information bits.

The transmitter device 404 may determine 417 a permutation matrix π, and permute 419 the k information using the permutation matrix π.

After applying the permutation matrix π to the k information bits, the transmitter device 404 may form 421 an information vector u by applying a reversed expansion matrix $\overleftarrow{E}$ to the k information bits to include additional bits in bit-reversed predetermined locations. In an aspect, the information vector u may include N bits. The reversed expansion matrix $\overleftarrow{E}$ may insert frozen bits in bit-reversed locations without bit-reversing information bit locations. $E^T$ is the transpose of the expansion matrix E (e.g., discussed above with reference to FIGS. 4A and 4B), and may remove frozen bits and keep information bits only. $\overleftarrow{E} \, \overleftarrow{E}^T$ is a k×k identity matrix, and $\pi \overleftarrow{E}$=EB, therefore π=EB$\overleftarrow{E}^T$ since $\overleftarrow{E} \, \overleftarrow{E}^T$=I. Therefore, the transmitter device 404 may be able to permute k bits instead of N bits, which may use a smaller circuit and enable parallel implementations to reduce latency.

The transmitter device 404 may apply 423 a non-reversed encoding matrix $F^{\otimes \, log \, 2N}$ to obtain a codeword vector x 408 (e.g., x=$u_4$π$\overleftarrow{E}$F) for transmission to the receiver device 406. In one aspect, the non-reversed encoding matrix $F^{\otimes \, log \, 2N}$ may be applied after applying the reversed expansion matrix $\overleftarrow{E}$. In another aspect, the non-reversed encoding matrix $F^{\otimes \, log \, 2N}$ may be applied at the same time as the reversed expansion matrix $\overleftarrow{E}$.

Figure 6B:
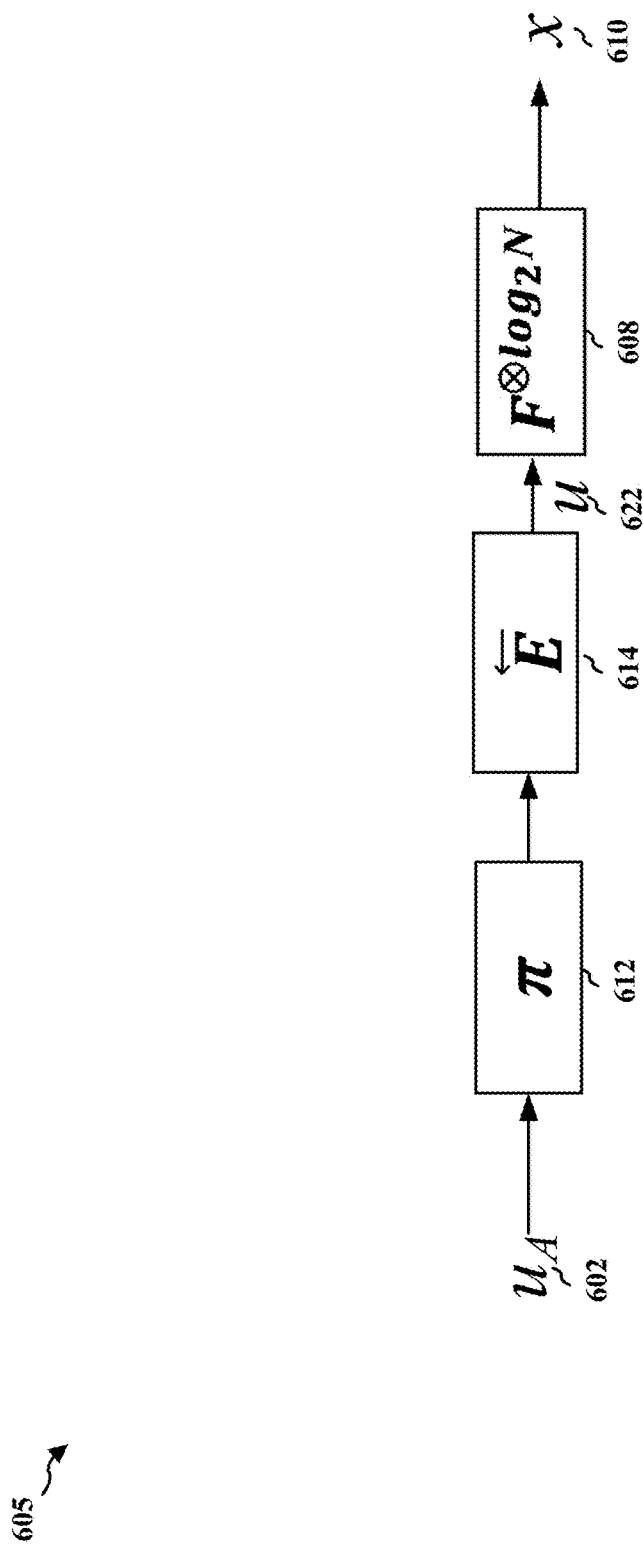
FIG. 6B is a diagram of a bit-reversal technique in accordance with one aspect of the present disclosure.

An illustration of the bit-reversal technique described above with reference to the FIG. 4C can be seen in FIG. 6B.

Bit Reversal at Receiver

Figure 4D:
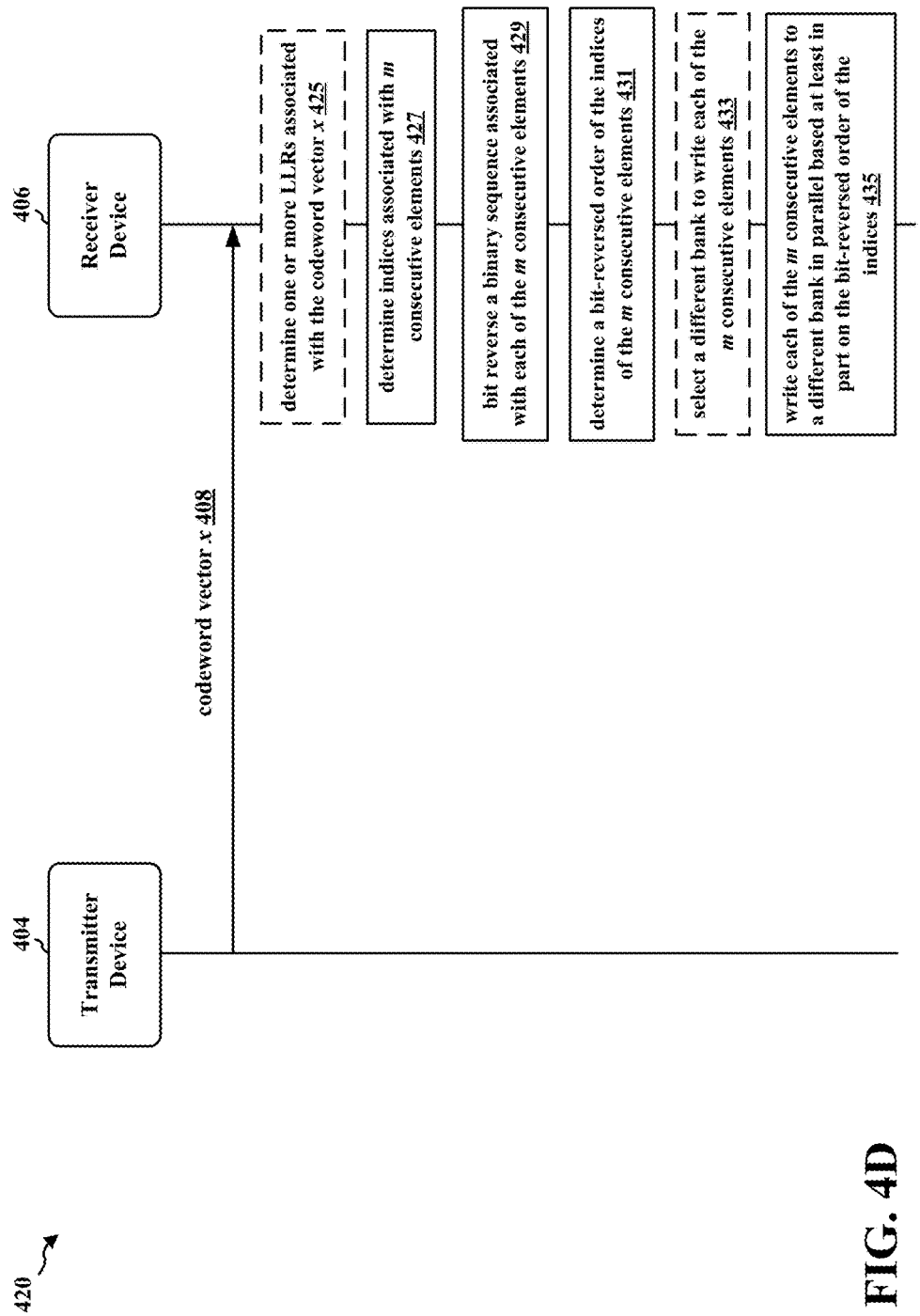
FIG. 4D a data flow for performing polar decoding of a signal in accordance with certain aspects of the disclosure.

FIG. 4D illustrates a data flow 420 for performing polar decoding of a signal received at a receiver device 406 from a transmitter device 404 in accordance with certain aspects of the disclosure. The transmitter device 404 may correspond to, e.g., the base station 102, 180, the eNB 310, the UE 104, 182, 350, the transmitter device 1250, the apparatus 902/902', 1502/1502'. The receiver device 406 may correspond to, e.g., the base station 102, 180, the eNB 310, the UE 104, 182, 350, the receiver device 950, 1550, the apparatus 1202/1202'. In one configuration, the transmitter device 404 may be a base station, and the receiver device 406 may be a UE. In certain other configurations, the transmitter device 404 may be a UE, and the receiver device 406 may be a base station. In FIG. 4D, optional operations are indicated with dashed lines.

Referring to FIG. 4D, the receiver device 406 may receive a codeword vector x 408 from the transmitter device 404. In an aspect, the codeword vector x 408 may include at least in part m consecutive elements.

Receiver device 406 may determine 425 one or more log-likelihood ratios (LLRs) y associated with the codeword vector x 408. In an aspect, the m consecutive elements may include the one or more LLRs. LLRs may be determined by a demodulator at the receiver device 406 that determines whether the bits in each of the m consecutive elements are more likely to be a 0 or a 1, and how much more likely. The LLRs may be used for processing at the polar decoder (e.g., as an estimate of the m consecutive elements).

Receiver device 406 may determine 427 indices associated with m consecutive elements. In an aspect, each of the m consecutive elements may be associated with a different index (e.g., 0 to m−1) and each of the m consecutive elements may include at least in part k information bits.

In addition, the receiver device 406 may bit reverse 429 a binary sequence associated with each of the m consecutive elements. For example, the receiver device 406 may bit reverse 429 the binary sequence associated with each of the m consecutive elements (e.g., LLRs) by applying a bit-reversal permutation matrix B. In an aspect, the binary sequence associated with each of the m consecutive elements may have a different log 2(m) least significant bit.

In an aspect, each of the m consecutive elements may include a different binary sequence. Assuming m=4, the m consecutive elements may include a four-element sequence $u_0, u_1, u_2, u_3$. For example, the first element $u_0$ may have an original binary sequence of 00, the second element $u_1$ may have an original binary sequence of 01, the third element $u_2$ may have an original binary sequence of 10, and the fourth element $u_3$ may have an original binary sequence of 11. That is, the binary sequence associated with index 0 in the m consecutive elements (e.g., $u_0$) may be 00, the binary sequence associated with index 1 the m consecutive elements (e.g., $u_1$) may be 01, the binary sequence associated with index 2 the m consecutive elements (e.g., $u_2$) may be 10, and the binary sequence associated with index 3 the m consecutive elements (e.g., $u_3$) may be 11.

After bit-reversal, the first element $u_0$ may still have a binary sequence of 00, a second element $u_1$ may have a bit-reversed binary sequence of 10, a third element $u_2$ may have a non-bit reversed binary sequence of 01, and a fourth element $u_3$ may still have a binary sequence of 11. Each of the m consecutive elements may have a different most significant log 2(m) bit after the binary sequence is bit-reversed. Based at least in part on the bit-reversed binary sequence associated with each of the m elements, the receiver device 406 may determine 431 a bit-reversed order of the indices of the m consecutive elements. The bit-reversed order of the indices of the four-element sequence described above may be $u_0, u_2, u_1, u_3$.

Using the most significant log 2(m) bit after determining 431 the bit-reversed order of the indices of the m consecutive elements, the receiver device 406 may select 433 a different memory bank to write each of the m consecutive elements. An illustration of the memory bank selection technique using the most significant log 2(m) bit after determining 431 the bit-reversed order of the indices of can be seen in FIG. 7.

In one aspect, the receiver device 406 may write 435 each of the m consecutive elements to a different memory bank in parallel based at least in part on the bit-reversed order of the indices. In an aspect, each memory bank may be as narrow as a single LLR.

The polar decoder at the receiver device 406 may process the bit-reversed m consecutive elements to produce an estimate $u_A$ of the original information vector u. A description of the information vector u is discussed supra with respect to FIGS. 4A, 4B, and 4C.

Figure 6C:
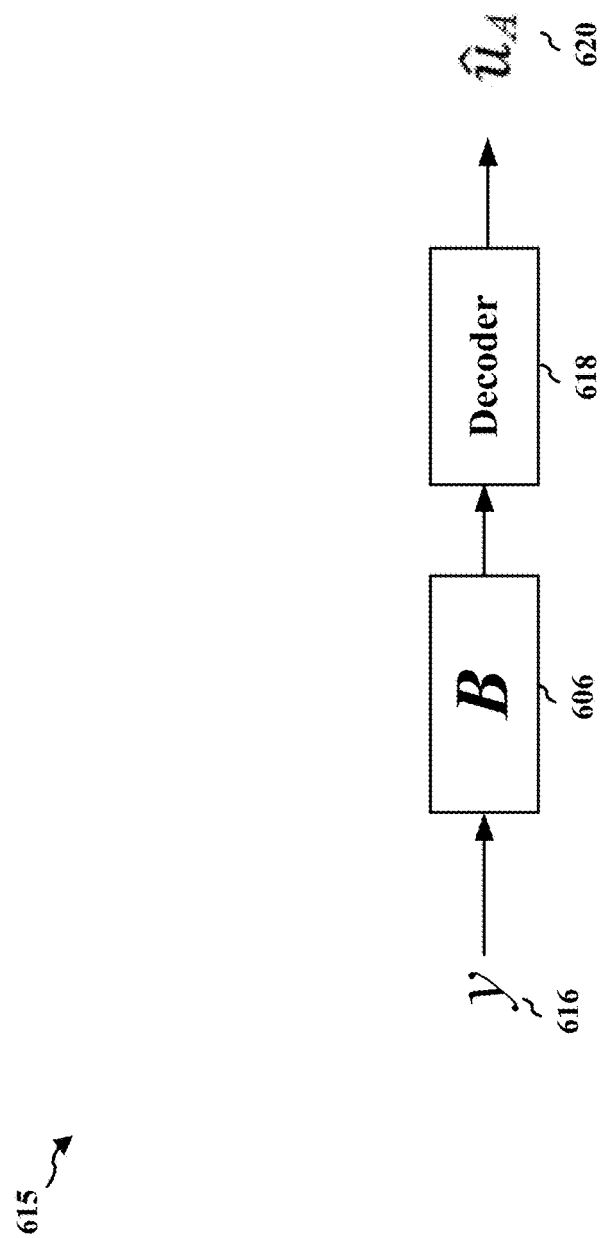
FIG. 6C is a diagram of a bit-reversal technique in accordance with one aspect of the present disclosure.

An illustration of the bit-reversal technique described above with respect to FIG. 4D can be seen in FIG. 6C.

FIG. 5A is a diagram 500 illustrating that the information vector u 502 may be bit-reversed 504 (e.g., using matrix B) before encoding 506 (e.g., using matrix $F^{\otimes \log_2 N}$) and transmitted via channel 508 to the polar decoder 510 at the receiver device.

FIG. 5B is a diagram 505 illustrating that the information vector u 502 may be bit-reversed 504 (e.g., using matrix B) after encoding 506 (e.g., using matrix $F^{\otimes \log_2 N}$) and transmitted via channel 508 to the polar decoder 510 at the receiver device.

FIG. 5C is a diagram 515 illustrating that the information vector u 502 may be encoded 506 (e.g., using matrix $F^{\otimes \log_2 N}$) and transmitted via channel 508 to a receiver device that bit-reverses 504 (e.g., using matrix B) the codeword vector x before decoding 510 at the polar decoder 510.

FIG. 6A is a diagram of the bit-reversal technique 600 used by a transmitter device in accordance with certain aspects of the disclosure. The transmitter device may correspond to, e.g., the base station 102, 180, the eNB 310, the UE 104, 182, 350, the transmitter device 404, 1250, the apparatus 902/902', 1502/1502'. The bit-reversal technique 600 may correspond to, e.g., the technique described supra with reference to FIGS. 4A and 4B.

Referring to FIG. 6A, an (N, k) polar code may be used to encode information bits $u_A$ 602 (e.g., k number of bits) into a codeword vector x 610. For example, information bits $u_A$ 602 may be multiplied by an expansion matrix E 604 to form an information vector u 622. A permutation matrix B 606 may be applied to the information vector u 622 prior to being multiplied by a generator matrix $F^{\otimes \log_2 N}$ 608 to form the codeword vector x 610 (e.g., $x = u_A E B F$). The codeword vector x 610 may be transmitted by the transmitter device to the receiver device (e.g., the base station 102, 180, the eNB 310, the UE 104, 182, 350, the receiver device 406, 950, 1550, the apparatus 1202/1202').

FIG. 6B is a diagram of the bit-reversal technique 605 used by a transmitter device in accordance with certain aspects of the disclosure. The transmitter device may correspond to, e.g., the base station 102, 180, the eNB 310, the UE 104, 182, 350, the transmitter device 404, 1250, the apparatus 902/902', 1502/1502'. The bit-reversal technique 605 may correspond to, e.g., the technique described supra with reference to FIG. 4C.

Referring to FIG. 6B, the transmitter device may determine 415 indices associated with m consecutive elements $u_A$ 602. In an aspect, each of the m consecutive elements $u_A$ 602 may be associated with a different index. In another aspect, each of the m consecutive elements $u_A$ 602 may include at least in part k information bits.

The transmitter device permute the k information bits of element $u_A$ 602 using the permutation matrix π 612. After applying the permutation matrix π 612 to the k information bits, the transmitter device may form an information vector u 622 by applying a reversed expansion matrix $\overleftarrow{E}$ 614 to the k information bits to include additional bits in bit-reversed predetermined locations. In an aspect, the information vector u 622 may include N bits. The reversed expansion matrix $\overleftarrow{E}$ may insert frozen bits in bit-reversed locations without bit-reversing information bit locations.

The transmitter device may apply a non-reversed encoding matrix $F^{\otimes \log_2 N}$ 608 to obtain a codeword vector x 610 (e.g., $x = u_A \pi \overleftarrow{E} F$). In one aspect, the non-reversed encoding matrix $F^{\otimes \log_2 N}$ 608 may be applied after applying the reversed expansion matrix $\overleftarrow{E}$ 614. In another aspect, the non-reversed encoding matrix $F^{\otimes \log_2 N}$ 608 may be applied concurrently with the reversed expansion matrix $\overleftarrow{E}$ 614. The codeword vector x 610 may be transmitted by the transmitter device to the receiver device (e.g., the base station 102, 180, the eNB 310, the UE 104, 182, 350, the receiver device 406, 950, 1550, the apparatus 1202/1202').

FIG. 6C is a diagram of the bit-reversal technique 615 used by a receiver device in accordance with certain aspects of the disclosure. The receiver device may correspond to, e.g., the base station 102, 180, the eNB 310, the UE 104, 182, 350, the receiver device 406, 950, 1550, the apparatus 1202/1202'. The bit-reversal technique 615 illustrated in FIG. 6C may correspond to, e.g., the technique described above with respect to FIG. 4D.

The codeword vector x (e.g., see codeword vector x 610 illustrated in FIGS. 6A and 6B) may be received as vector y 616 (e.g., codeword vector x with noise) by a receiver device over a communication channel. A decoder at the receiver device may receive a vector y 616 that represents the codeword vector x with noise picked up from the communication channel. The decoder 618 may process the vector y 616 to produce an estimate $\hat{u}_A$ 620 of the original information vector u 622.

Figure 7:
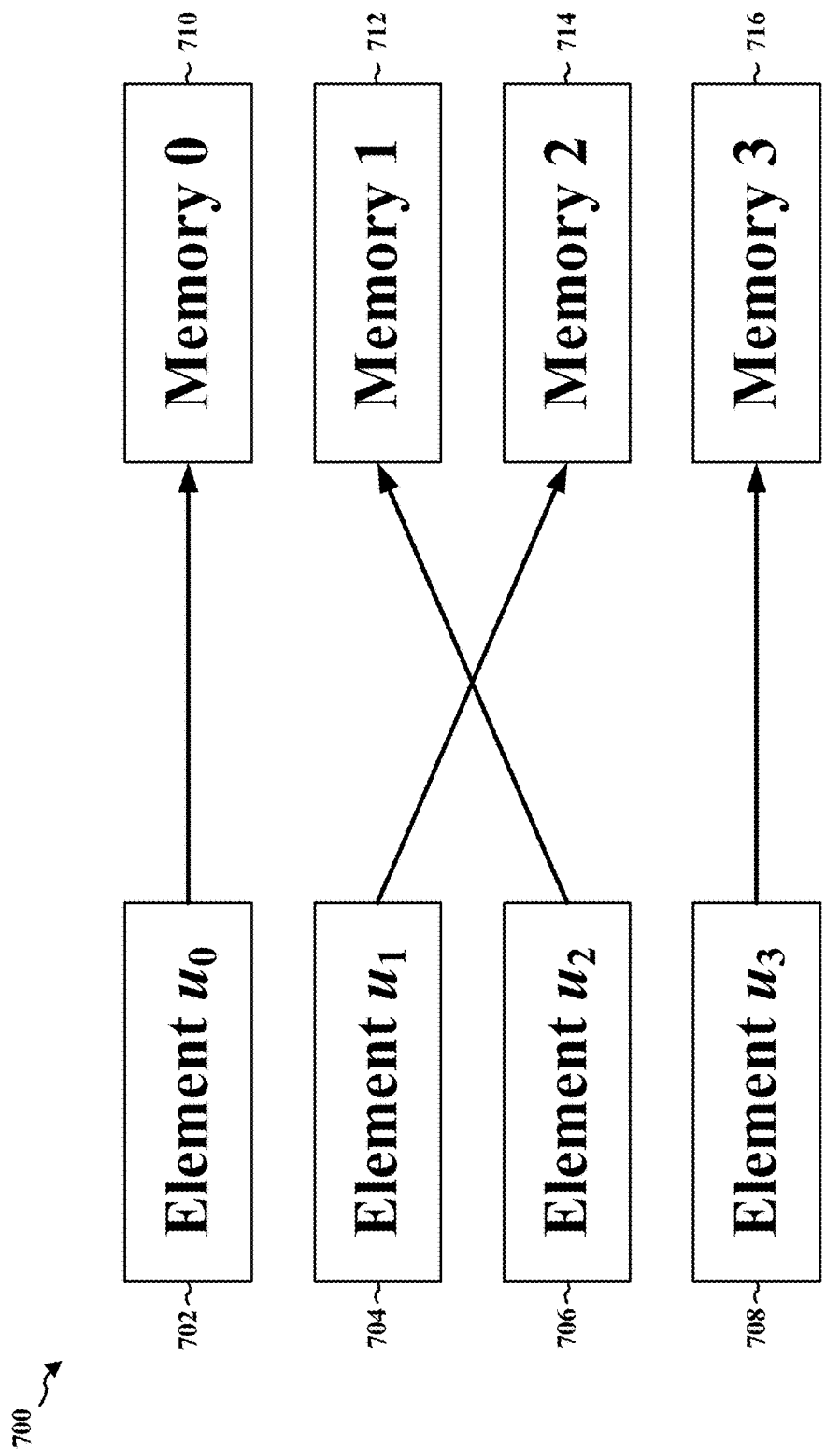
FIG. 7 is a diagram illustrating a selection of memory banks using the most significant log 2(m) bit after determining the bit-reversed order of the indices of the m consecutive elements.

FIG. 7 is a diagram 700 illustrating a technique for memory banks selection using the most significant log 2(m) bit after determining the bit-reversed order of the indices of the m consecutive elements in accordance with certain aspects of the disclosure. The memory bank selection technique may be used by a transmitter device (e.g., the base station 102, 180, the eNB 310, the UE 104, 182, 350, the transmitter device 404, 1250, the apparatus 902/902', 1502/1502').

In an aspect, each of the m consecutive elements may include a different binary sequence. Assuming m=4, the information vector u may include a four-element sequence $u_0$ 702, $u_1$ 704, $u_2$ 706, $u_3$ 708. By way of example, the first element $u_0$ 702 may have an original binary sequence of 00, the second element $u_1$ 704 may have an original binary sequence of 01, the third element $u_2$ 706 may have an original binary sequence of 10, and the fourth element $u_3$ 708 may have an original binary sequence of 11. That is, the binary sequence associated with index 0 in information vector u (e.g., $u_0$ 702) may be 00, the binary sequence associated with index 1 in information vector u (e.g., $u_1$ 704) may be 01, the binary sequence associated with index 2 in information vector u (e.g., $u_2$ 706) may be 10, and the binary sequence associated with index 3 (e.g., $u_3$ 708) in information vector u may bell.

After bit-reversal, the first element $u_0$ 702 may still have a binary sequence of 00, a second element $u_1$ 704 may have a bit-reversed binary sequence of 10, a third element $u_2$ 706 may have a non-bit reversed binary sequence of 01, and the fourth element $u_3$ 708 may still have a binary sequence of 11. Each of the m consecutive elements may have a different most significant log 2(m) bit after the binary sequence is bit-reversed. The bit-reversed order of the indices of the four-element sequence may be $u_0$ 702, $u_2$ 706, $u_1$ 704, $u_3$ 708. Hence, the first element $u_0$ 702 may be written to memory 0 710, the third element $u_2$ 706 may be written to memory 1 712, the second element $u_1$ 704 may be written to memory 2 714, and the fourth element $u_3$ 708 may be written to memory 3 716.

Figure 8:
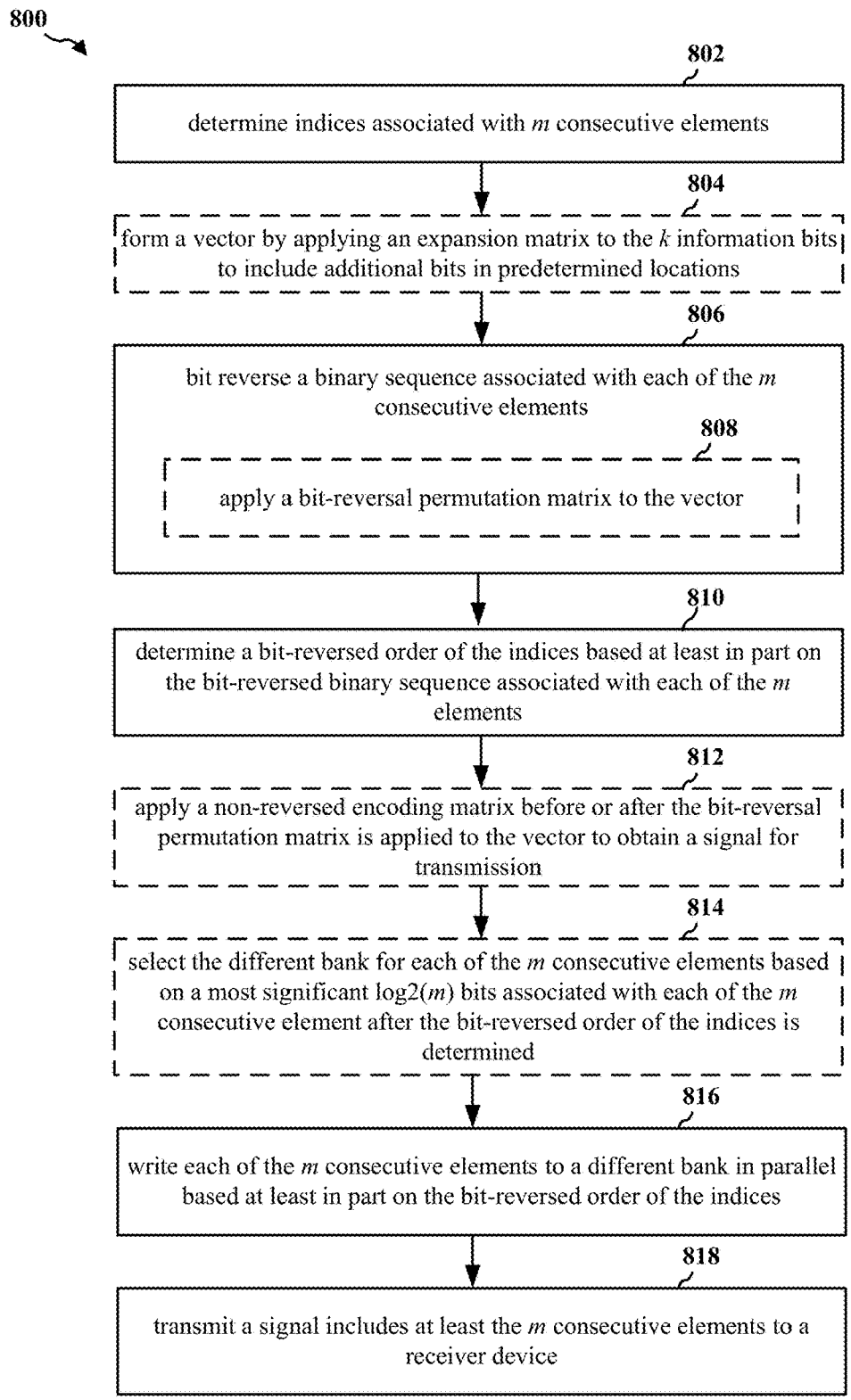
FIG. 8 is a flowchart of a method of wireless communication.

FIG. 8 is a flowchart 800 for a method of wireless communication. The method 800 may be performed using a transmitter device (e.g., the base station 102, 180, the eNB 310, the UE 104, 182, 350, the transmitter device 404, 1250, the apparatus 902/902', 1502/1502') in communication with a receiver device (e.g., the base station 102, 180, the eNB 310, the UE 104, 182, 350, the receiver device 406, 950, 1550, the apparatus 1202/1202'). In one configuration, the transmitter device may be a base station, and the receiver device may be a UE. In one configuration, the transmitter device may be a UE, and the receiver device may be a base station. In FIG. 8, optional operations are indicated with dashed lines.

At 802, the transmitter device may determine indices associated with m consecutive elements. In an aspect, each of the m consecutive elements may be associated with a different index. In another aspect, each of the m consecutive elements may include at least in part k information bits. For example, referring to FIGS. 4A and 4B, transmitter device 404 may determine 401 indices associated with m consecutive elements. In an aspect, each of the m consecutive elements may be associated with a different index (e.g., 0 to m−1) and each of the m consecutive elements may include at least in part k information bits.

At 804, the transmitter device may form a vector by applying an expansion matrix to the k information bits to include additional bits in predetermined locations. In an aspect, the vector may include N bits. For example, referring to FIGS. 4A and 4B, the transmitter device 404 may form 403 an information vector u by applying an expansion matrix E to the k information bits to include additional bits in predetermined locations. For example, the additional bits may be j frozen bits (e.g., 0s inserted at predetermined locations in each element). In an aspect, the information vector u may include N bits (e.g., (k information bits)+(j frozen bits)=N bits of the information vector u).

At 806, the transmitter device may bit reverse a binary sequence associated with each of the m consecutive elements. In an aspect, each of the m consecutive elements may include a different binary sequence. In another aspect, each binary sequence associated with each of the m consecutive elements may have a different log 2(m) least significant bits. In a further aspect, each of the m consecutive elements may have different log 2(m) most significant bits after the binary sequence is bit-reversed. For example, referring to FIGS. 4A and 4B, the transmitter device 404 may bit reverse 405 a binary sequence associated with each of the m consecutive elements. In an aspect, the binary sequence associated with each of the m consecutive elements may have a different log 2(m) least significant bit. In an aspect, each of the m consecutive elements may include a different binary sequence. Assuming m=4, the information vector u may include a four-element sequence $u_0$, $u_1$, $u_2$, $u_3$. By way of example, the first element $u_0$ may have an original binary sequence of 00, the second element $u_1$ may have an original binary sequence of 01, the third element $u_2$ may have an original binary sequence of 10, and the fourth element $u_3$ may have an original binary sequence of 11. That is, the binary sequence associated with index 0 in information vector u may be 00, the binary sequence associated with index 1 in information vector u may be 01, the binary sequence associated with index 2 in information vector u may be 10, and the binary sequence associated with index 3 in information vector u may be 11. After bit-reversal, the first element $u_0$ may still have a binary sequence of 00, a second element $u_1$ may have a bit-reversed binary sequence of 10, a third element $u_2$ have a non-bit reversed binary sequence of 01, and the fourth element $u_3$ may still have a binary sequence of 11. Each of the m consecutive elements may have a different most significant log 2(m) bit after the binary sequence is bit-reversed.

At 808, the transmitter device may bit reverse a binary sequence associated with each of the m consecutive elements by applying a bit-reversal permutation matrix to the vector. For example, referring to FIGS. 4A and 4B, the transmitter device 404 may bit reverse 405 the binary sequence associated with each of the m consecutive elements by applying a bit-reversal permutation matrix B to the information vector u.

At 810, the transmitter device may determine a bit-reversed order of the indices based at least in part on the bit-reversed binary sequence associated with each of the m elements. For example, referring to FIGS. 4A and 4B, based at least in part on the bit-reversed binary sequence associated with each of the m elements, the transmitter device 404 may determine 407 a bit-reversed order of the indices of the m consecutive elements. Still assuming m=4, the bit-reversed order of the indices of the four-element sequence may be $u_0$, $u_2$, $u_1$, $u_3$.

At 812, the transmitter device may apply a non-reversed encoding matrix after the bit-reversal permutation matrix is applied to the vector to obtain a signal for transmission. For example, referring to FIGS. 4A and 4B, to obtain the codeword vector x 408 (e.g., $x=u_4 EBF$) for transmission, transmitter device 404 may apply 413 a non-reversed encoding matrix $F^{\otimes \log_2 N}$ to information vector u. In an aspect $$F = \begin{bmatrix} 1 & 0 \\ 1 & 1 \end{bmatrix}.$$

In one configuration, transmitter device 404 may apply 413 the non-reversed encoding matrix $F^{\otimes \log_2 N}$ before the bit-reversal permutation matrix B is applied to the information vector u, as discussed supra with respect to FIG. 5A. In another configuration, transmitter device 404 may apply 413 the non-reversed encoding matrix $F^{\otimes \log_2 N}$ after the bit-reversal permutation matrix B is applied to the information vector u, as discussed supra with respect to FIG. 5B.

At 814, the transmitter device may select the different memory bank for each of the m consecutive elements based on the most significant log 2(m) bits associated with each of the m consecutive element after the bit-reversed order of the indices is determined. For example, referring to FIGS. 4A and 4B, using the most significant log 2(m) bit after determining 407 the bit-reversed order of the indices of the m consecutive elements, the transmitter device 404 may select 409 a different memory bank to write each of the m consecutive elements. Additional details of the memory bank selection technique using the most significant log 2(m) bit after determining 407 the bit-reversed order of the indices are described above with reference to FIG. 7.

At 816, the transmitter device may write each of the m consecutive elements to a different memory bank in parallel (e.g., concurrently) based at least in part on the bit-reversed order of the indices. For example, referring to FIGS. 4A and 4B, the transmitter device 404 may write 411 each of the m consecutive elements to a different memory bank in parallel based at least in part on the bit-reversed order of the indices.

At 818, the transmitter device may transmit a signal includes at least the m consecutive elements to a receiver device. For example, referring to FIGS. 4A and 4B, the transmitter device 404 may convert m consecutive bits of information (e.g., consecutive elements) into codeword vector x 408 (e.g., signals and/or tones) that are polar encoded and transmitted to the receiver device 406.

Figure 9:
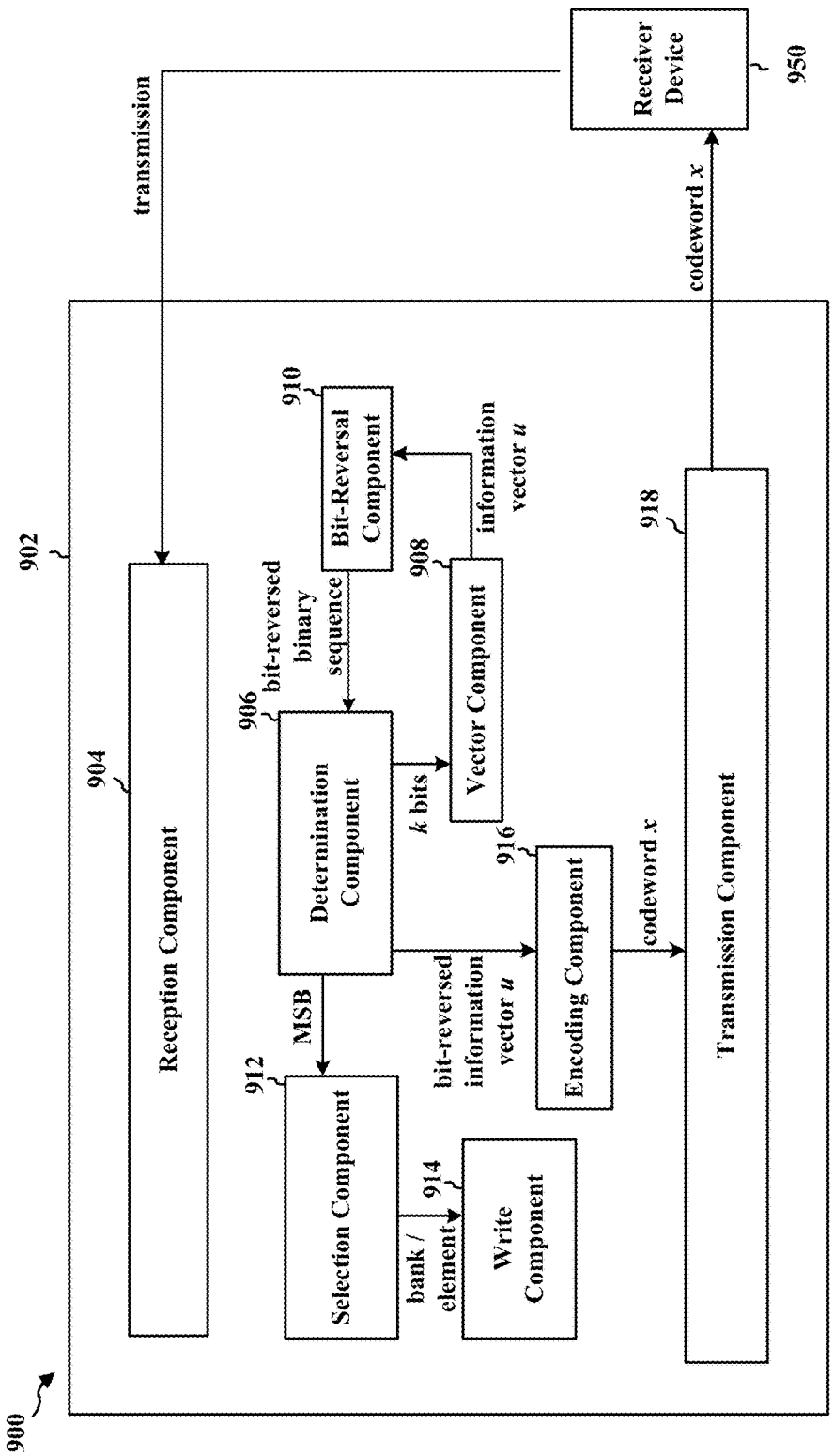
FIG. 9 is a conceptual data flow diagram illustrating the data flow between different means/components in an exemplary apparatus.

FIG. 9 is a conceptual data flow diagram 900 illustrating the data flow between different means/components in an exemplary apparatus 902. The apparatus may be a transmitter device (e.g., the base station 102, 180, the eNB 310, the UE 104, 182, 350, the transmitter device 404, 1250, the apparatus 902/902', 1502/1502') in communication with receiver device 950 (e.g., the base station 102, 180, the eNB 310, the UE 104, 182, 350, the receiver device 406, 1550, the apparatus 1202/1202'). In one configuration, the apparatus 902 may be a base station, and the receiver device 950 may be a UE. In one configuration, the apparatus 902 may be a UE, and the receiver device 950 may be a base station.

The apparatus may include a reception component 904 that may be configured to receive uplink (UL) transmissions from receiver device 950. The apparatus may also include a determination component 906 that may be configured to determine indices associated with m consecutive elements. In an aspect, each of the m consecutive elements may be associated with a different index. In another aspect, each of the m consecutive elements may include at least in part k information bits. Determination component 906 may be configured to send a signal associated with the k information bits to vector component 908. Vector component 908 may be configured to form a vector by applying an expansion matrix to the k information bits to include additional bits in pre-determined locations. In an aspect, the vector may include N bits. Vector component 908 may be configured to send a signal associated with the information vector u to bit-reversal component 910. Bit-reversal component 910 may be configured to bit reverse a binary sequence associated with each of the m consecutive elements. In an aspect, each of the m consecutive elements may include a different binary sequence. In another aspect, each binary sequence associated with each of the m consecutive elements may have a different log 2(m) least significant bits. In a further aspect, each of the m consecutive elements may have different log 2(m) most significant bits (MSB) after the binary sequence is bit-reversed. For example, bit-reversal component 910 may be configured to bit reverse a binary sequence associated with each of the m consecutive elements by applying a bit-reversal permutation matrix to the vector. Bit-reversal component 910 may be configured to send a signal associated with the bit-reversed binary sequence of each of the m consecutive elements to determination component 906. Determination component 906 may be configured to determine a bit-reversed order of the indices based at least in part on the bit-reversed binary sequence associated with each of the m elements. Determination component 906 may be configured to send a signal associated with the bit-reversed information vector u to encoding component 916. Encoding component 916 may be configured to apply a non-reversed encoding matrix after the bit-reversal permutation matrix is applied to the vector to obtain a signal (e.g., codeword x) for transmission. Encoding component 916 may be configured to send a signal associated with codeword x to transmission component 918. Transmission component 918 may be configured to transmit the codeword x to receiver device 950 in a downlink (DL) transmission. In addition, determination component 906 may be configured to send a signal associated with the MSB to selection component 912. Selection component 912 may be configured to select a different memory bank for each of the m consecutive elements based on the most significant log 2(m) bits associated with each of the m consecutive element after the bit-reversed order of the indices is determined. Selection component 912 may be configured to send a signal associated with the selected banks to write component 914. Write component 914 may be configured to write each of the m consecutive elements to a different memory bank in parallel based at least in part on the bit-reversed order of the indices.

The apparatus may include additional components that perform each of the blocks of the algorithm in the aforementioned flowchart of FIG. 8. As such, each block in the aforementioned flowchart of FIG. 8 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 10:
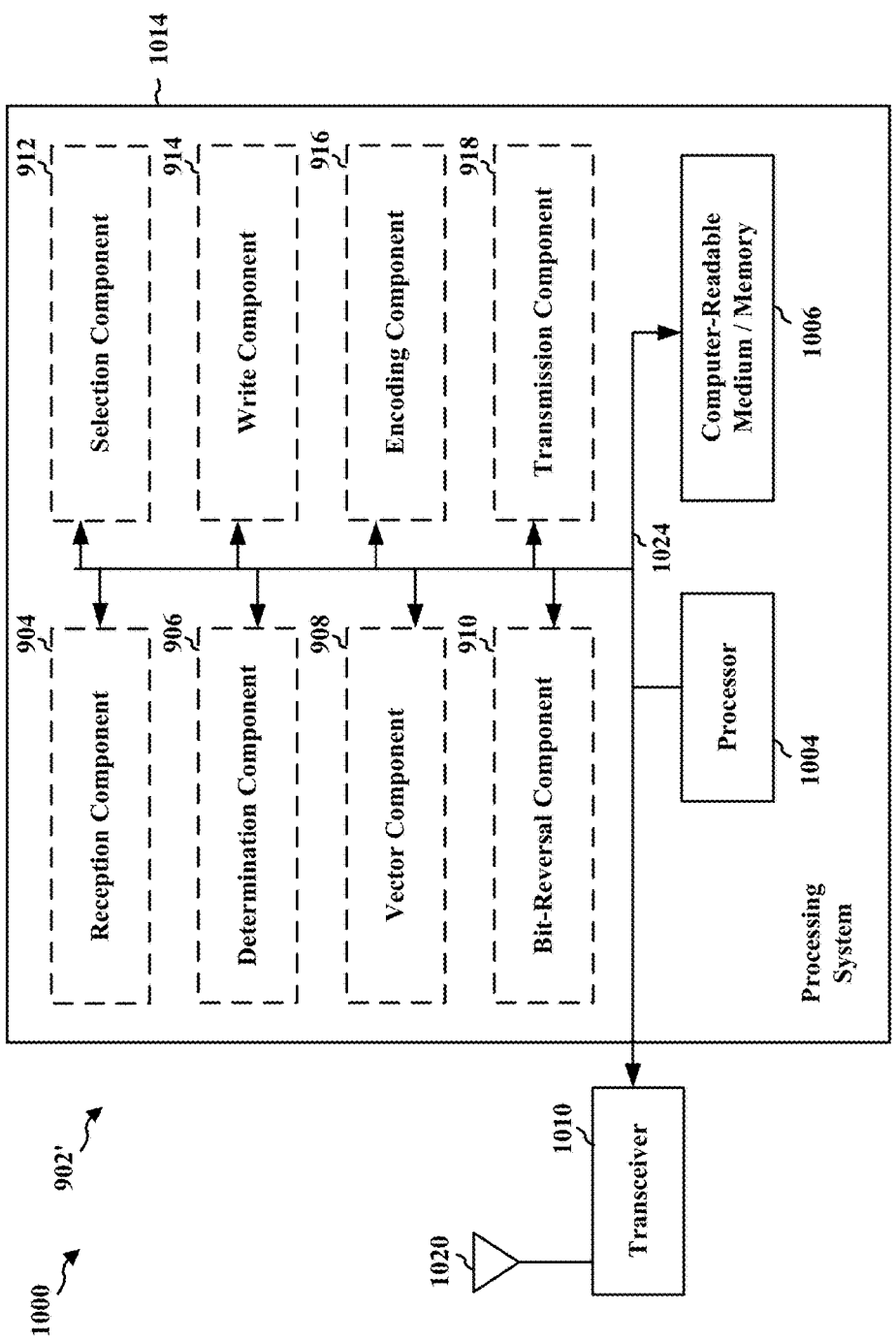
FIG. 10 is a diagram illustrating an example of a hardware implementation for an apparatus employing a processing system.

FIG. 10 is a diagram 1000 illustrating an example of a hardware implementation for an apparatus 902' employing a processing system 1014. The processing system 1014 may be implemented with a bus architecture, represented generally by the bus 1024. The bus 1024 may include any number of interconnecting buses and bridges depending on the specific application of the processing system 1014 and the overall design constraints. The bus 1024 links together various circuits including one or more processors and/or hardware components, represented by the processor 1004, the components 904, 906, 908, 910, 912, 914, 916, 918, and the computer-readable medium/memory 1006. The bus 1024 may also link various other circuits such as timing sources, peripherals, voltage regulators, and power management circuits, which are well known in the art, and therefore, will not be described any further.

The processing system 1014 may be coupled to a transceiver 1010. The transceiver 1010 is coupled to one or more antennas 1020. The transceiver 1010 provides a means for communicating with various other apparatus over a transmission medium. The transceiver 1010 receives a signal from the one or more antennas 1020, extracts information from the received signal, and provides the extracted information to the processing system 1014, specifically the reception component 904. In addition, the transceiver 1010 receives information from the processing system 1014, specifically the transmission component 918, and based on the received information, generates a signal to be applied to the one or more antennas 1020. The processing system 1014 includes a processor 1004 coupled to a computer-readable medium/memory 1006. The processor 1004 is responsible for general processing, including the execution of software stored on the computer-readable medium/memory 1006. The software, when executed by the processor 1004, causes the processing system 1014 to perform the various functions described supra for any particular apparatus. The computer-readable medium/memory 1006 may also be used for storing data that is manipulated by the processor 1004 when executing software. The processing system 1014 further includes at least one of the components 904, 906, 908, 910, 912, 914, 916, 918. The components may be software components running in the processor 1004, resident/stored in the computer readable medium/memory 1006, one or more hardware components coupled to the processor 1004, or some combination thereof. The processing system 1014 may be a component of the eNB 310 and may include the memory 376 and/or at least one of the TX processor 316, the RX processor 370, and the controller/processor 375.

In one configuration, the apparatus 902/902' for wireless communication may include means for determining indices associated with m consecutive elements. In an aspect, each of the m consecutive elements may be associated with a different index. In another aspect, each of the m consecutive elements may include at least in part k information bits. In another configuration, the apparatus 902/902' for wireless communication may include means for forming a vector by applying an expansion matrix to the k information bits to include additional bits in predetermined locations. In an aspect, the vector may include N bits. In a further configuration, the apparatus 902/902' for wireless communication may include means for bit reversing a binary sequence associated with each of the m consecutive elements. In an aspect, each of the m consecutive elements may include a different binary sequence. In another aspect, each binary sequence associated with each of the m consecutive elements may have different log 2(m) least significant bits. For example, the means for bit reversing the binary sequence associated with each of the m consecutive elements may be configured to apply a bit-reversal permutation matrix to the vector. In one configuration, the apparatus 902/902' for wireless communication may include means for determining a bit-reversed order of the indices based at least in part on the bit-reversed binary sequence associated with each of the m elements. In an aspect, each of the m consecutive elements may have different log 2(m) most significant bits after the binary sequence is bit-reversed. In one configuration, the apparatus 902/902' for wireless communication may include means for selecting the different memory bank for each of the m consecutive elements based on the most significant log 2(m) bits associated with each of the m consecutive element after the bit-reversed order of the indices is determined. In a further configuration, the apparatus 902/902' for wireless communication may include means for writing each of the m consecutive elements to a different memory bank in parallel based at least in part on the bit-reversed order of the indices. In another configuration, the apparatus 902/902' for wireless communication may include means for applying a non-reversed encoding matrix after the bit-reversal permutation matrix is applied to the vector to obtain a signal for transmission. The aforementioned means may be one or more of the aforementioned components of the apparatus 902 and/or the processing system 1014 of the apparatus 902' configured to perform the functions recited by the aforementioned means. As described supra, the processing system 1014 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

Figure 11:
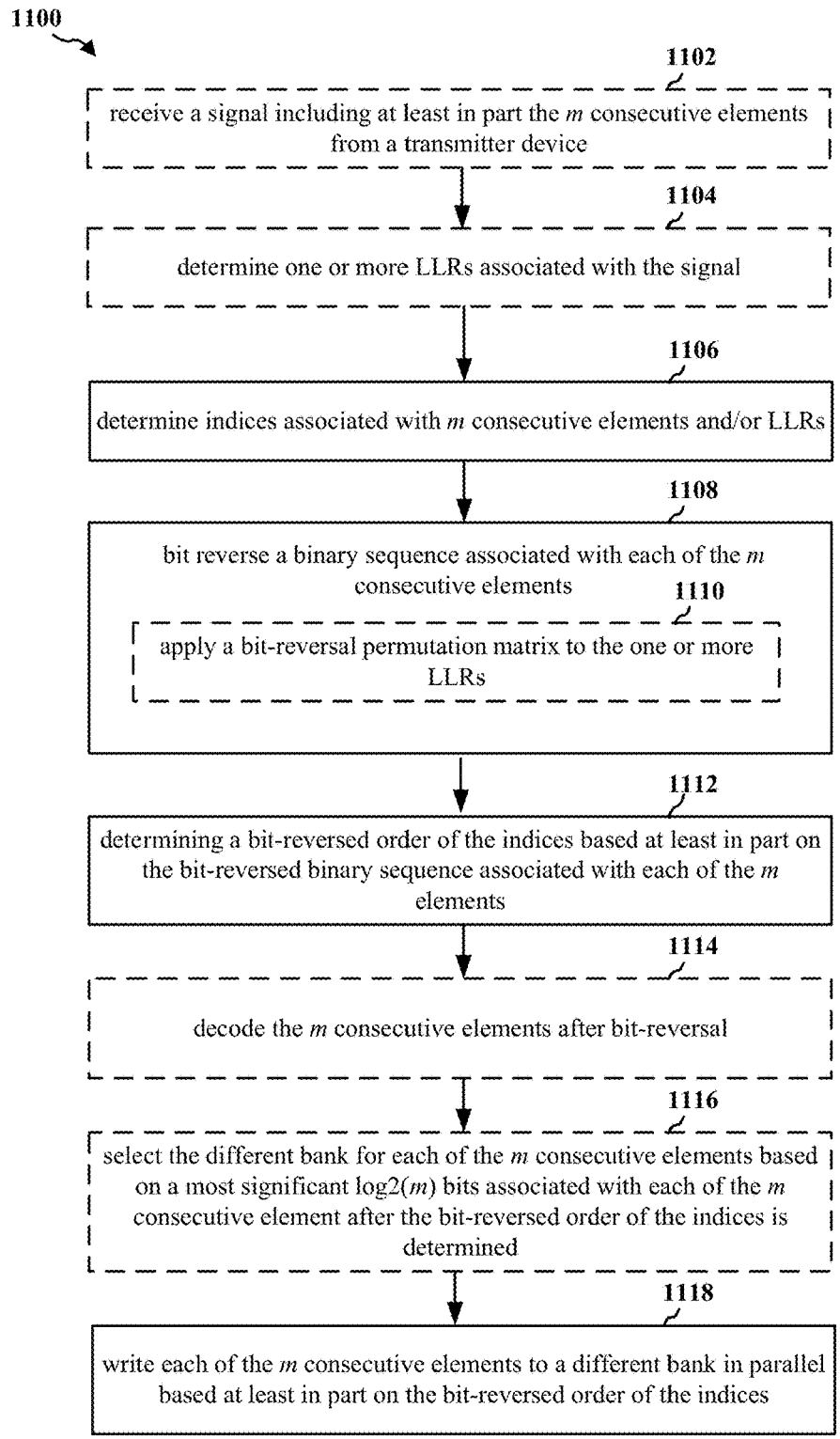
FIG. 11 is a flowchart of a method of wireless communication.

FIG. 11 is a flowchart 1100 for a method of wireless communication. The method 1100 may be performed using a receiver device (e.g., the base station 102, 180, the eNB 310, the UE 104, 182, 350, the receiver device 406, 950, 1550, the apparatus 1202/1202') in communication with a transmitter device (e.g., the base station 102, 180, the eNB 310, the UE 104, 182, 350, the transmitter device 404, 1250, the apparatus 902/902', 1502/1502'). In one configuration, the receiver device may be a base station, and the transmitter device may be a UE. In one configuration, the receiver device may be a UE, and the transmitter device may be a base station. In FIG. 11, optional operations are indicated with dotted lines.

At 1102, the receiver device may receive a signal from a transmitter, the signal may include at least in part the m consecutive elements. For example, referring to FIG. 4C, the receiver device 406 may receive a codeword vector x 408 from the transmitter device 404. In an aspect, the codeword vector x 408 may include at least in part m consecutive elements.

At 1104, the receiver device may determine one or more LLRs associated with the signal. In an aspect, the m consecutive elements may include the one or more LLRs. For example, referring to FIG. 4C, receiver device 406 may determine 425 one or more log-likelihood ratios (LLRs) y associated with the codeword vector x 408. In an aspect, the m consecutive elements may include the one or more LLRs. LLRs may be determined by a demodulator at the receiver device 406 that determines whether the bits in each of the m consecutive elements are more likely to be a 0 or a 1, and how much more likely the bits are a 0 or a 1.

At 1106, the receiver device may determine indices associated with m consecutive elements. In an aspect, each of the m consecutive elements may be associated with a different index. For example, referring to FIG. 4C, receiver device 406 may determine 427 indices associated with m consecutive elements. In an aspect, each of the m consecutive elements may be associated with a different index (e.g., 0 to m−1) and each of the m consecutive elements may include at least in part k information bits.

At 1108, the receiver device may bit reverse a binary sequence associated with each of the m consecutive elements. In an aspect, each of the m consecutive elements may include a different binary sequence. In an aspect, each binary sequence associated with each of the m consecutive elements may have different log 2(m) least significant bits. In another aspect, each of the m consecutive elements may have different log 2(m) most significant bits after the binary sequence is bit-reversed. For example, referring to FIG. 4C, the receiver device 406 may bit reverse 429 a binary sequence associated with each of the m consecutive elements. In an aspect, the binary sequence associated with each of the m consecutive elements may have a different log 2(m) least significant bit. In an aspect, each of the m consecutive elements may include a different binary sequence. Assuming m=4, the m consecutive elements may include a four-element sequence $u_0$, $u_1$, $u_2$, $u_3$. For example, the first element $u_0$ may have an original binary sequence of 00, the second element $u_1$ may have an original binary sequence of 01, the third element $u_2$ may have an original binary sequence of 10, and the fourth element $u_3$ may have an original binary sequence of 11. That is, the binary sequence associated with index 0 in the m consecutive elements may be 00, the binary sequence associated with index 1 the m consecutive elements may be 01, the binary sequence associated with index 2 the m consecutive elements may be 10, and the binary sequence associated with index 3 the m consecutive elements may be 11. After bit-reversal, the first element $u_0$ may still have a binary sequence of 00, a second element $u_1$ may have a bit-reversed binary sequence of 10, a third element $u_2$ have a non-bit reversed binary sequence of 01, and a fourth element $u_3$ may still have a binary sequence of 11.

At 1110, the receiver device may bit reverse a binary sequence associated with each of the m consecutive elements by applying a bit-reversal permutation matrix to the one or more LLRs. For example, referring to FIG. 4C, the receiver device 406 may bit reverse 429 the binary sequence associated with each of the m consecutive elements (e.g., LLRs) by applying a bit-reversal permutation matrix B.

At 1112, the receiver device may determine a bit-reversed order of the indices based at least in part on the bit-reversed binary sequence associated with each of the m elements. For example, referring to FIG. 4C, each of the m consecutive elements may have a different most significant log 2(m) bit after the binary sequence is bit-reversed. Based at least in part on the bit-reversed binary sequence associated with each of the m elements, the receiver device 406 may determine 431 a bit-reversed order of the indices of the m consecutive elements. Still assuming m=4, the bit-reversed order of the indices of the four-element sequence may be $u_0$, $u_2$, $u_1$, $u_3$.

At 1114, the receiver device may decode the one or more LLRs to obtain information bits. For example, referring to FIG. 4C, the polar decoder at the receiver device 406 may process the bit-reversed m consecutive elements to produce an estimate $\hat{u}_A$ of the original information vector u.

At 1116, the receiver device may select the different memory bank for each of the m consecutive elements based on the most significant log 2(m) bits associated with each of the m consecutive element after the bit-reversed order of the indices is determined. For example, referring to FIG. 4C, using the most significant log 2(m) bit after determining 431 the bit-reversed order of the indices of the m consecutive elements, the receiver device 406 may select 433 a different memory bank to write each of the m consecutive elements.

At 1118, the receiver device may write each of the m consecutive elements to a different memory bank in parallel based at least in part on the bit-reversed order of the indices. For example, referring to FIG. 4C, the receiver device 406 may write 435 each of the m consecutive elements to a different memory bank in parallel based at least in part on the bit-reversed order of the indices. In an aspect, each memory bank may be as narrow as a single LLR.

Figure 12:
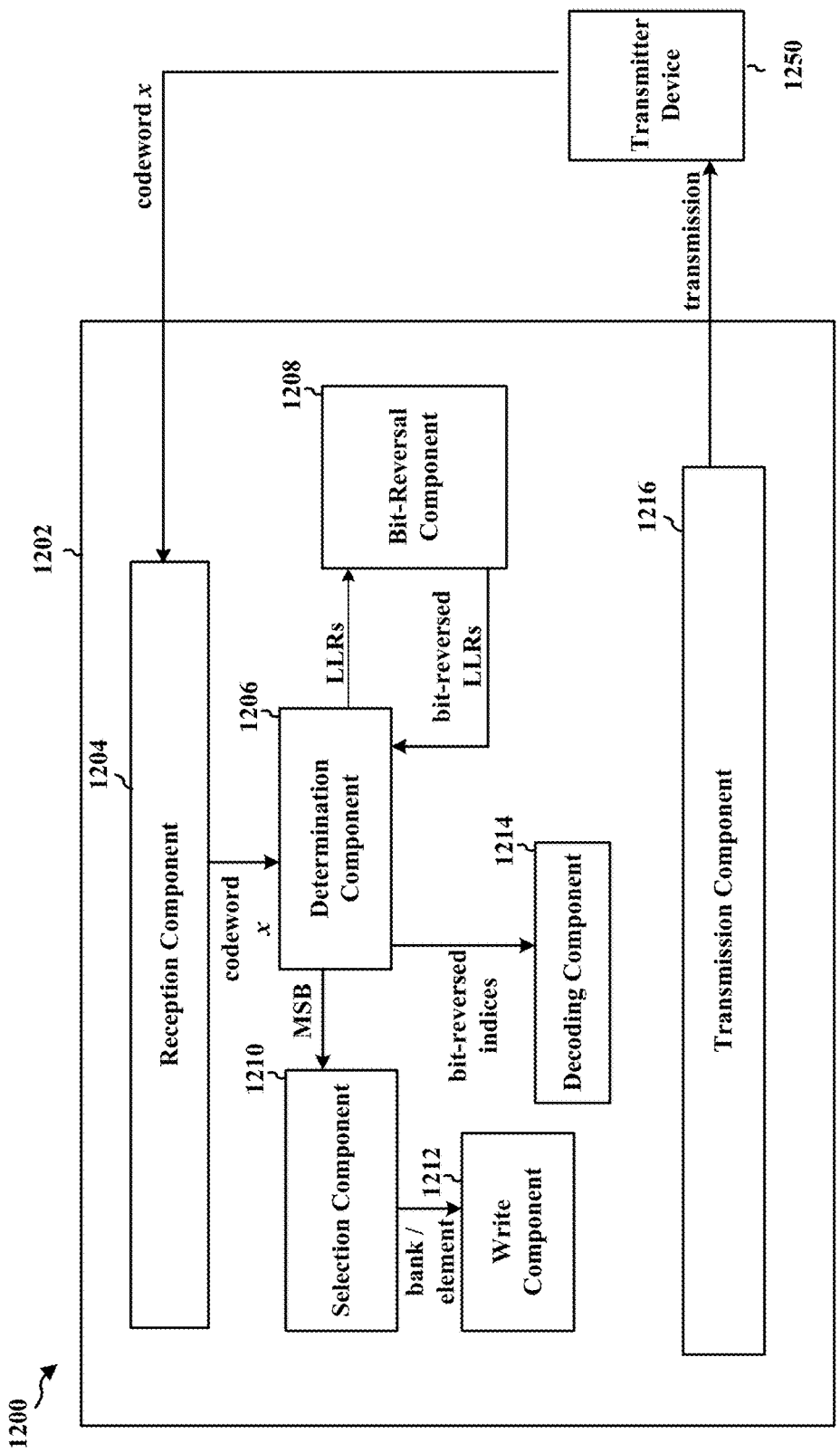
FIG. 12 is a conceptual data flow diagram illustrating the data flow between different means/components in an exemplary apparatus.

FIG. 12 is a conceptual data flow diagram 1200 illustrating the data flow between different means/components in an exemplary apparatus 1202. The apparatus may be a receiver device (e.g., the base station 102, 180, the eNB 310, the UE 104, 182, 350, the receiver device 406, 950, 1550, the apparatus 1202/1202') in communication with a transmitter device 1250 (e.g., the base station 102, 180, the eNB 310, the UE 104, 182, 350, the transmitter device 404, the apparatus 902/902', 1502/1502'). In one configuration, the apparatus may be a base station, and the transmitter device may be a UE. In one configuration, the apparatus may be a UE, and the transmitter device may be a base station.

The apparatus may include a reception component 1204 that may be configured to receive a codeword x from transmitter device 1250. Reception component 1204 may be configured to send a signal associated with codeword x to determination component 1206. Determination component 1206 may be configured to determine one or more LLRs associated with the signal. In an aspect, the m consecutive elements may include the one or more LLRs. In addition, determination component 1206 may be configured to determine indices associated with m consecutive elements. In an aspect, each of the m consecutive elements may be associated with a different index. Determination component 1206 may be configured to send a signal associated with the one or more LLRs to bit-reversal component 1208. Bit-reversal component 1208 may be configured to bit reverse a binary sequence associated with each of the m consecutive elements (e.g., LLRs). For example, bit-reversal component 1208 may be configured to bit reverse a binary sequence associated with each of the m consecutive elements by applying a bit-reversal permutation matrix to the one or more LLRs. In an aspect, each of the m consecutive elements may include a different binary sequence. In an aspect, each binary sequence associated with each of the m consecutive elements may have different log 2(m) least significant bits. In another aspect, each of the m consecutive elements may have different log 2(m) most significant bits after the binary sequence is bit-reversed. Bit-reversal component 1208 may be configured to send a signal associated with the bit-revered LLRs to determination component 1206. Determination component 1206 may be configured to determine a bit-reversed order of the indices based at least in part on the bit-reversed binary sequence associated with each of the m elements. Determination component 1206 may be configured to send a signal associated with the bit-reversed indices of the m consecutive elements (e.g., LLRs) to decoding component 1214. Decoding component 1214 may be configured to decode the one or more LLRs to obtain information bits. In addition, determination component 1206 may be configured to send a signal associated with the MSB after the bit reversal to selection component 1210. Selection component 1210 may be configured to select the different memory bank for each of the m consecutive elements based on the most significant log 2(m) bits associated with each of the m consecutive element after the bit-reversed order of the indices is determined. Selection component 1210 may be configured to send a signal associated with the selected banks to write component 1212. Write component 1212 may be configured to write each of the m consecutive elements to a different memory bank in parallel based at least in part on the bit-reversed order of the indices. The apparatus may also include a transmission component 1216 that be configured to send transmissions to the transmitter device 1250.

The apparatus may include additional components that perform each of the blocks of the algorithm in the aforementioned flowchart of FIG. 11. As such, each block in the aforementioned flowchart of FIG. 11 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 13:
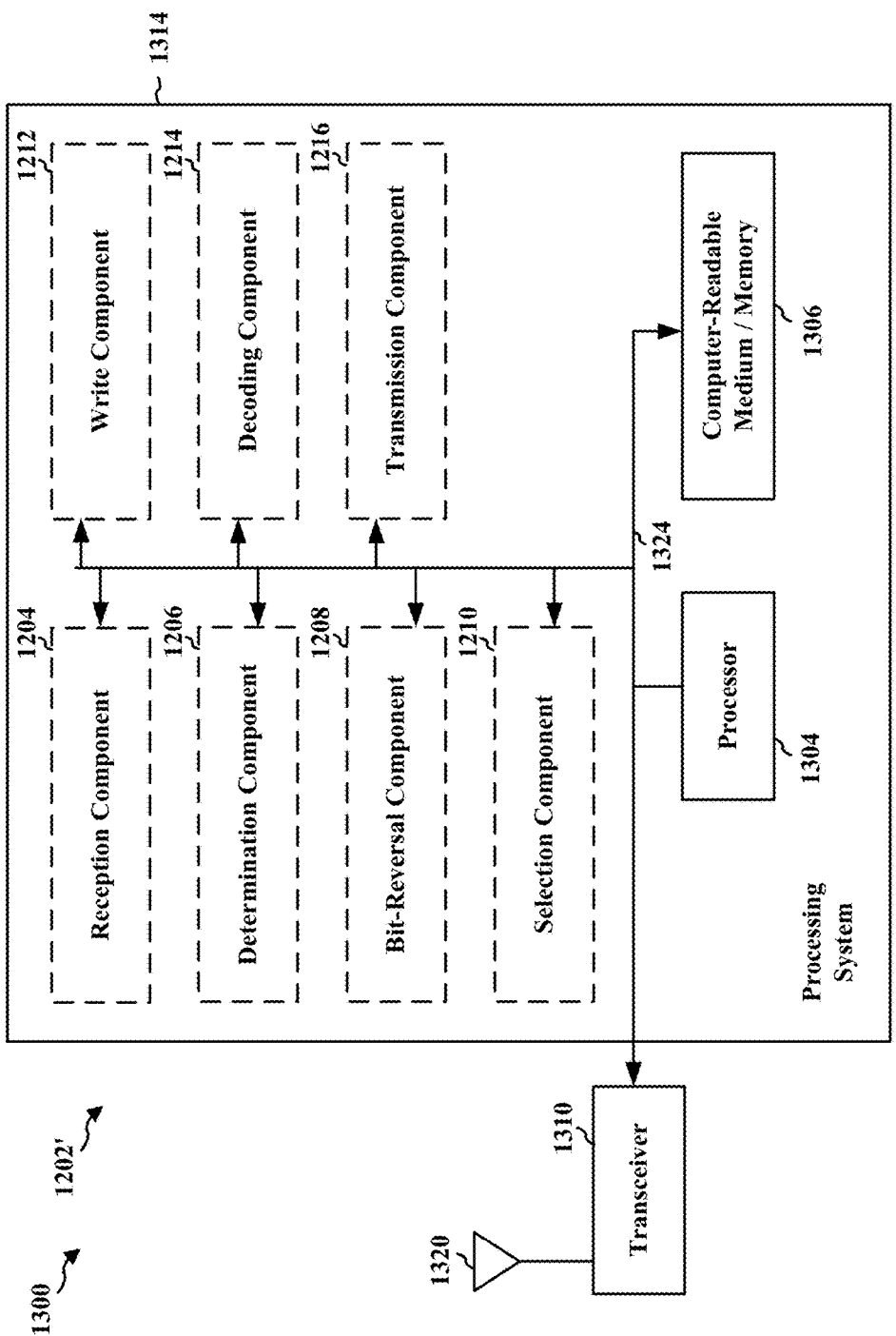
FIG. 13 is a diagram illustrating an example of a hardware implementation for an apparatus employing a processing system.

FIG. 13 is a diagram 1300 illustrating an example of a hardware implementation for an apparatus 1202' employing a processing system 1314. The processing system 1314 may be implemented with a bus architecture, represented generally by the bus 1324. The bus 1324 may include any number of interconnecting buses and bridges depending on the specific application of the processing system 1314 and the overall design constraints. The bus 1324 links together various circuits including one or more processors and/or hardware components, represented by the processor 1304, the components 1204, 1206, 1208, 1210, 1212, 1214, 1216, and the computer-readable medium/memory 1306. The bus 1324 may also link various other circuits such as timing sources, peripherals, voltage regulators, and power management circuits, which are well known in the art, and therefore, will not be described any further.

The processing system 1314 may be coupled to a transceiver 1310. The transceiver 1310 is coupled to one or more antennas 1320. The transceiver 1310 provides a means for communicating with various other apparatus over a transmission medium. The transceiver 1310 receives a signal from the one or more antennas 1320, extracts information from the received signal, and provides the extracted information to the processing system 1314, specifically the reception component 1204. In addition, the transceiver 1310 receives information from the processing system 1314, specifically the transmission component 1216, and based on the received information, generates a signal to be applied to the one or more antennas 1320. The processing system 1314 includes a processor 1304 coupled to a computer-readable medium/memory 1306. The processor 1304 is responsible for general processing, including the execution of software stored on the computer-readable medium/memory 1306. The software, when executed by the processor 1304, causes the processing system 1314 to perform the various functions described supra for any particular apparatus. The computer-readable medium/memory 1306 may also be used for storing data that is manipulated by the processor 1304 when executing software. The processing system 1314 further includes at least one of the components 1204, 1206, 1208, 1210, 1212, 1214, 1216. The components may be software components running in the processor 1304, resident/stored in the computer readable medium/memory 1306, one or more hardware components coupled to the processor 1304, or some combination thereof. The processing system 1314 may be a component of the UE 350 and may include the memory 360 and/or at least one of the TX processor 368, the RX processor 356, and the controller/processor 359.

In one configuration, the apparatus 1202/1202' for wireless communication may include means for receiving a signal from a transmitter. In one aspect, the signal may include at least in part the m consecutive elements. In another configuration, the apparatus 1202/1202' for wireless communication may include means for determining one or more LLRs associated with the signal. In an aspect, the m consecutive elements may include the one or more LLRs. In a further configuration, the apparatus 1202/1202' for wireless communication may include means for determining indices associated with m consecutive elements. In an aspect, each of the m consecutive elements may be associated with a different index. In one configuration, the apparatus 1202/1202' for wireless communication may include means for bit reversing a binary sequence associated with each of the m consecutive elements. In an aspect, each of the m consecutive elements may include a different binary sequence. In another aspect, each binary sequence associated with each of the m consecutive elements may have different log 2(m) least significant bits. In a further aspect, each of the m consecutive elements may have different log 2(m) most significant bits after the binary sequence is bit-reversed. For example, the means for bit reversing a binary sequence associated with each of the m consecutive may be configured to apply a bit-reversal permutation matrix to the one or more LLRs. In another configuration, the apparatus 1202/1202' for wireless communication may include means for determining a bit-reversed order of the indices based at least in part on the bit-reversed binary sequence associated with each of the m elements. In a further configuration, the apparatus 1202/1202' for wireless communication may include means for selecting the different memory bank for each of the m consecutive elements based on the most significant log 2(m) bits associated with each of the m consecutive element after the bit-reversed order of the indices is determined. In one configuration, the apparatus 1202/1202' for wireless communication may include means for writing each of the m consecutive elements to a different memory bank in parallel based at least in part on the bit-reversed order of the indices. In another configuration, the apparatus 1202/1202' for wireless communication may include means for decoding the one or more LLRs to obtain information bits. The aforementioned means may be one or more of the aforementioned components of the apparatus 1202 and/or the processing system 1314 of the apparatus 1202' configured to perform the functions recited by the aforementioned means. As described supra, the processing system 1314 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

Figure 14:
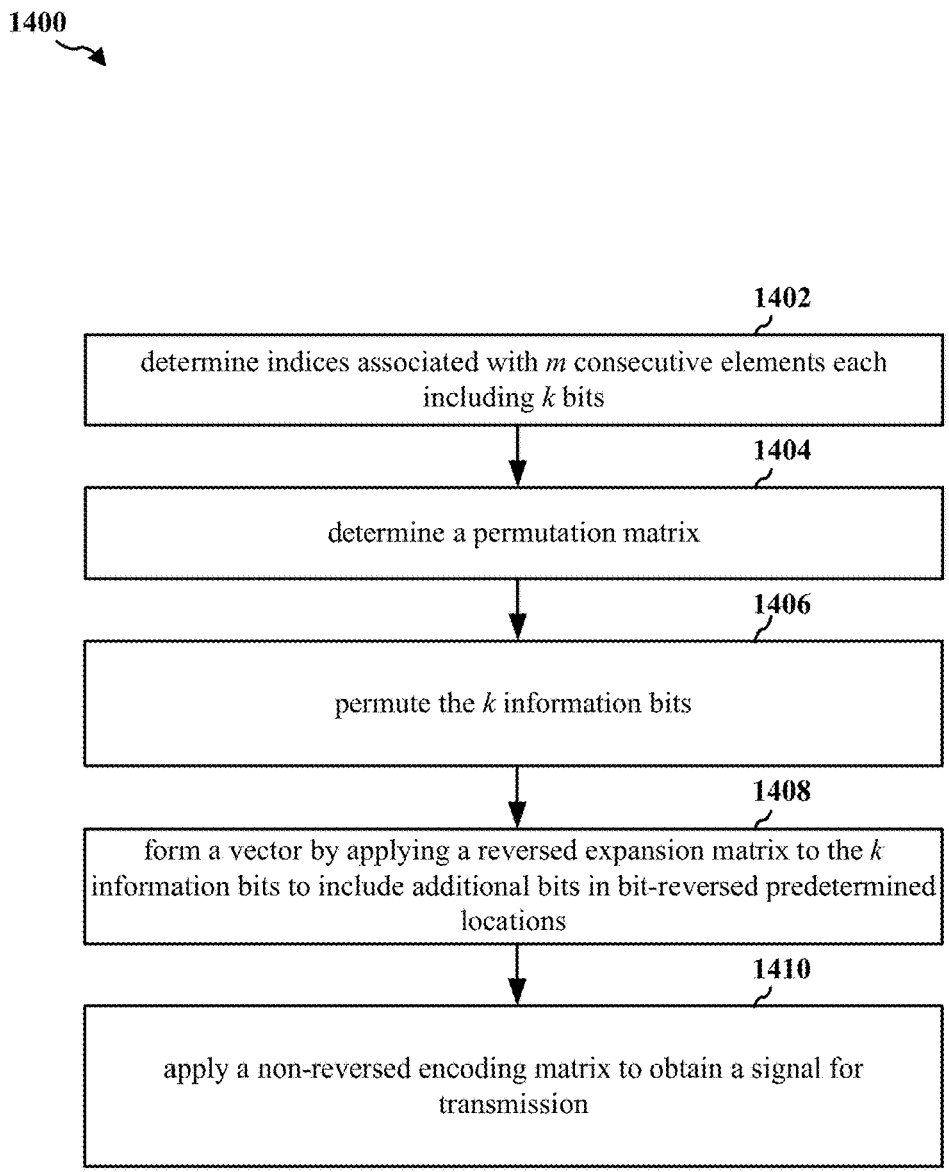
FIG. 14 is a flowchart of a method of wireless communication.

FIG. 14 is a flowchart 1400 for a method of wireless communication. The method 1400 may be performed using a transmitter device (e.g., the base station 102, 180, the eNB 310, the UE 104, 182, 350, the transmitter device 404, 1250, the apparatus 902/902', 1502/1502') in communication with a receiver device (e.g., the base station 102, 180, the eNB 310, the UE 104, 182, 350, the receiver device 406, 950, 1550, the apparatus 1202/1202'). In one configuration, the transmitter device may be a base station, and the receiver device may be a UE. In one configuration, the transmitter device may be a UE, and the receiver device may be a base station. In FIG. 14, optional operations are indicated with dotted lines.

At 1402, the transmitter device may determine indices associated with m consecutive elements. In an aspect, each of the m consecutive elements may be associated with a different index. In another aspect, each of the m consecutive elements may include at least in part k information bits. For example, referring to FIG. 4D, the transmitter device 404 may determine 415 indices associated with m consecutive elements. In an aspect, each of the m consecutive elements may be associated with a different index. In another aspect, each of the m consecutive elements may include at least in part k information bits.

At 1404, the transmitter device may determine a permutation matrix. For example, referring to FIG. 4D, the transmitter device 404 may determine 417 a permutation matrix $\pi$.

At 1406, the transmitter device may permute the k information bits. For example, referring to FIG. 4D, the transmitter device 404 may permute 419 the k information using the permutation matrix $\pi$.

At 1408, the transmitter device may form a vector by applying a reversed expansion matrix to the k information bits to include additional bits in bit-reversed predetermined locations. In an aspect, the vector may include N bits. For example, referring to FIG. 4D, after applying the permutation matrix $\pi$ to the k information bits, the transmitter device 404 may form 421 an information vector u by applying a reversed expansion matrix $\overleftarrow{E}$ to the k information bits to include additional bits in bit-reversed predetermined locations. In an aspect, the information vector u may include N bits. The reversed expansion matrix $\overleftarrow{E}$ may insert frozen bits in bit-reversed locations without bit-reversing information bit locations. $E^T$ is the transpose of the expansion matrix E (e.g., described above with reference to FIGS. 4A and 4B), and may remove frozen bits and keep information bits only. $\overleftarrow{E}\,\overleftarrow{E}^T$ is a k×k identity matrix, and $\pi \overleftarrow{E} = EB$, therefore $\pi = EB\overleftarrow{E}^T$ since $\overleftarrow{E}\,\overleftarrow{E}^T = I$. Therefore, the transmitter device 404 may be able to permute k instead of N bits, which may use a smaller circuit and enable highly-parallel implementations to reduce latency.

At 1410, the transmitter device may apply a non-reversed encoding matrix to obtain a signal for transmission. for example, referring to FIG. 4D, the transmitter device 404 may apply 423 a non-reversed encoding matrix $F^{\otimes\,log_2 N}$ after to obtain a codeword vector x 408 (e.g., $x = u_A \pi \overleftarrow{E} F$) for transmission to the receiver device 406. In one aspect, the non-reversed encoding matrix $F^{\otimes\,log_2 N}$ may be applied after applying the reversed expansion matrix $\overleftarrow{E}$. In another aspect, the non-reversed encoding matrix $F^{\otimes\,log_2 N}$ may be applied at the same time as the reversed expansion matrix $\overleftarrow{E}$.

Figure 15:
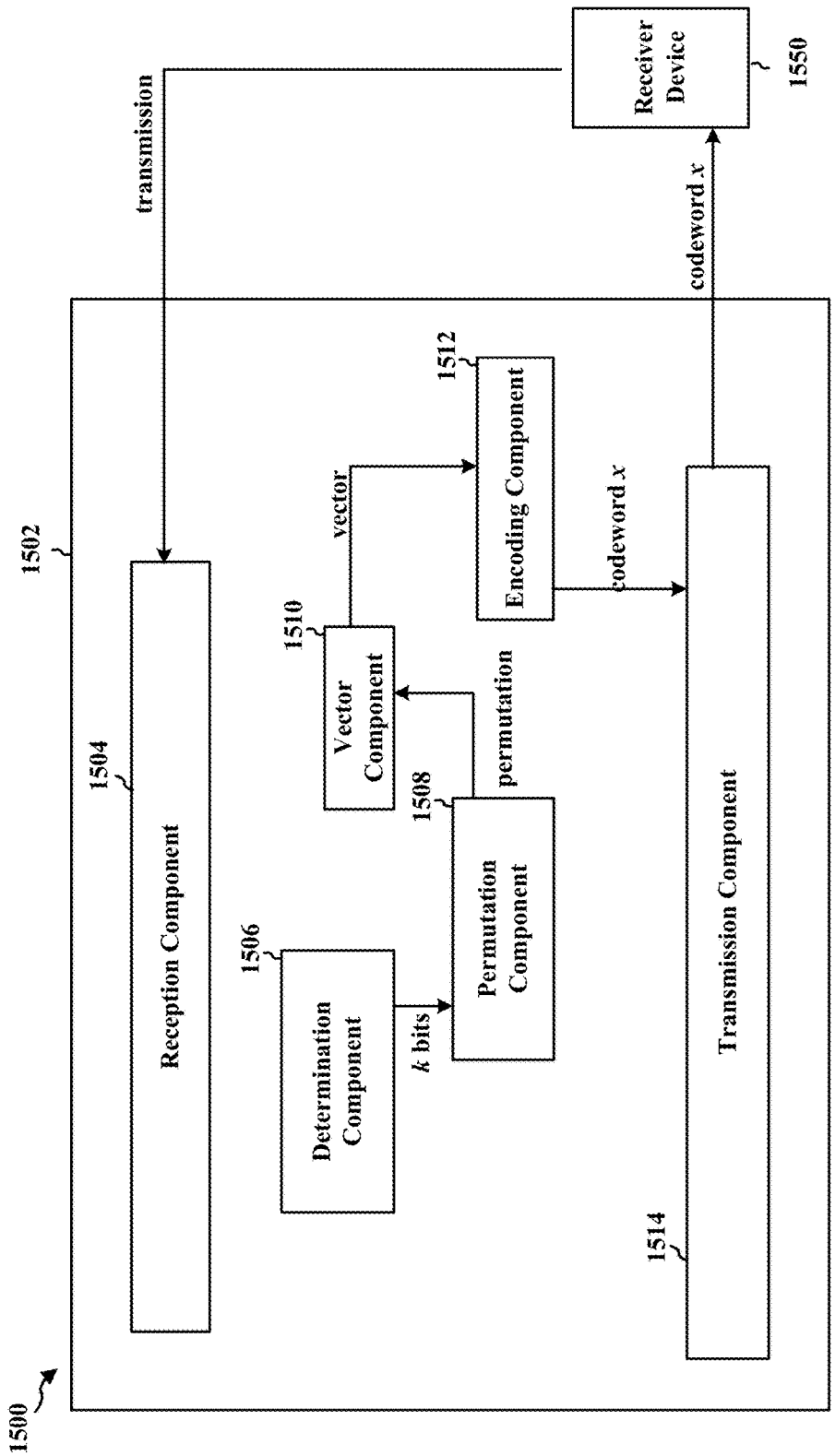
FIG. 15 is a conceptual data flow diagram illustrating the data flow between different means/components in an exemplary apparatus.

FIG. 15 is a conceptual data flow diagram 1500 illustrating the data flow between different means/components in an exemplary apparatus 1502. The apparatus may be a transmitter device (e.g., the base station 102, 180, the eNB 310, the UE 104, 182, 350, the transmitter device 404, 1250, the apparatus 902/902', 1502/1502') in communication with a receiver device 1550 (e.g., the base station 102, 180, the eNB 310, the UE 104, 182, 350, the receiver device 406, 950, the apparatus 1202/1202'). In one configuration, the apparatus may be a base station, and the receiver device may be a UE. In one configuration, the apparatus may be a UE, and the receiver device may be a base station. In FIG. 14, optional operations are indicated with dotted lines.

The apparatus may include a reception component 1504 that may be configured to receive transmission from the receiver device 1550. In addition, the apparatus may include a determination component 1506 that may be configured to determine indices associated with m consecutive elements. In an aspect, each of the m consecutive elements may be associated with a different index. In another aspect, each of the m consecutive elements may include at least in part k information bits. In addition, determination component 1506 may be configured to determine a permutation matrix. Determination component 1506 may be configured to send a signal associated with the k information bits to permutation component 1508. Permutation component 1508 may be configured to permute the k information bits using the permutation matrix. Permutation component 1508 may be configured to send a signal associated with the permuted k information bits to vector component 1510. Vector component 1510 may be configured to form a vector by applying a reversed expansion matrix to the k information bits to include additional bits in bit-reversed predetermined locations. In an aspect, the vector may include N bits. Vector component 1510 may be configured to send a signal associated with the vector to encoding component 1512. Encoding component 1512 may be configured to apply a non-reversed encoding matrix after the permutation matrix to obtain a signal (e.g., codeword vector x) for transmission. In addition, encoding component 1512 may be configured to send a signal associated with the codeword vector x to transmission component 1514. Transmission component may be configured to send a signal associated with codeword vector x to receiver device 1550.

The apparatus may include additional components that perform each of the blocks of the algorithm in the aforementioned flowchart of FIG. 14. As such, each block in the aforementioned flowchart of FIG. 14 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 16:
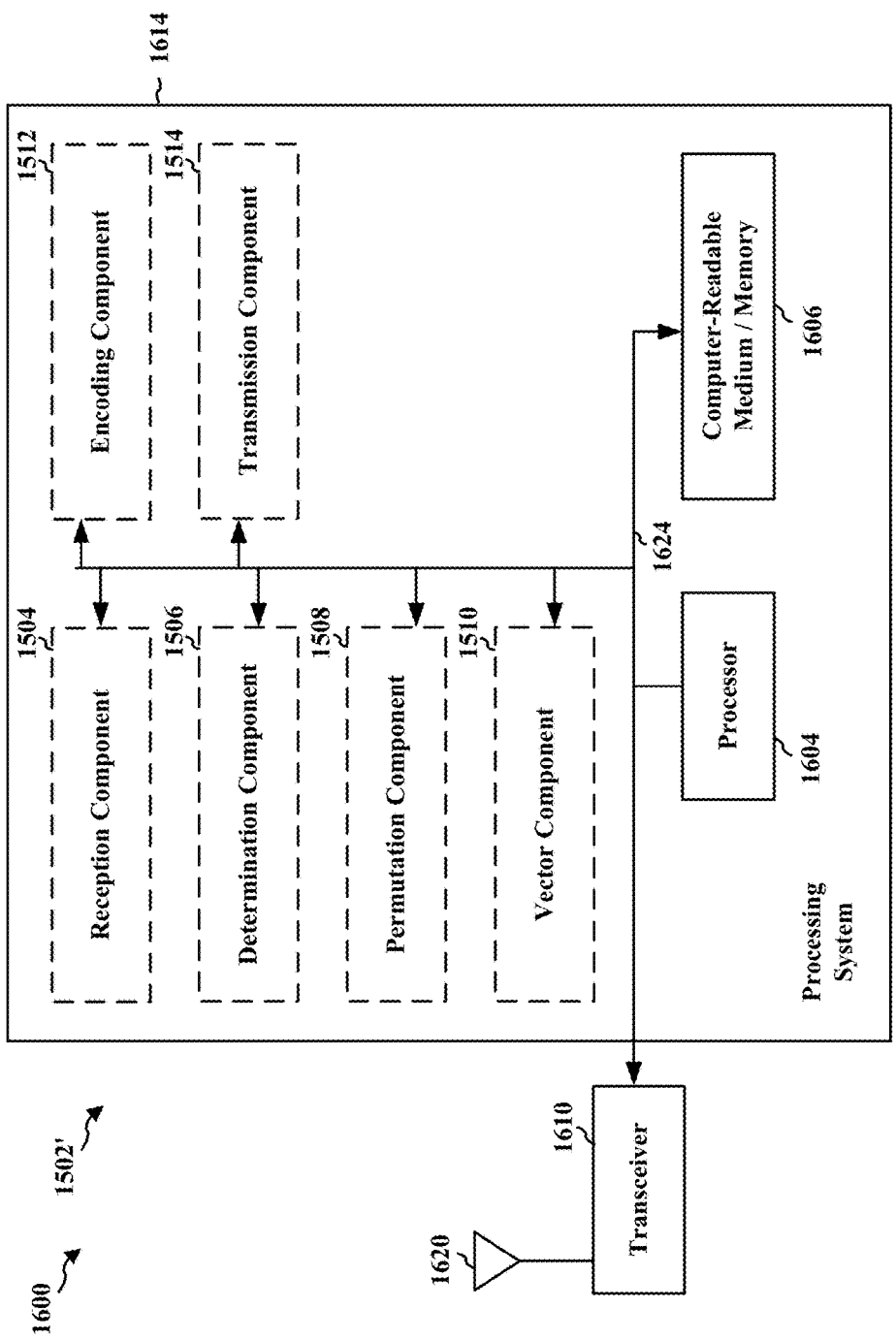
FIG. 16 is a diagram illustrating an example of a hardware implementation for an apparatus employing a processing system.

FIG. 16 is a diagram 1600 illustrating an example of a hardware implementation for an apparatus 1502' employing a processing system 1614. The processing system 1614 may be implemented with a bus architecture, represented generally by the bus 1624. The bus 1624 may include any number of interconnecting buses and bridges depending on the specific application of the processing system 1614 and the overall design constraints. The bus 1624 links together various circuits including one or more processors and/or hardware components, represented by the processor 1604, the components 1504, 1506, 1508, 1510, 1512, 1514, and the computer-readable medium/memory 1606. The bus 1624 may also link various other circuits such as timing sources, peripherals, voltage regulators, and power management circuits, which are well known in the art, and therefore, will not be described any further.

The processing system 1614 may be coupled to a transceiver 1610. The transceiver 1610 is coupled to one or more antennas 1620. The transceiver 1610 provides a means for communicating with various other apparatus over a transmission medium. The transceiver 1610 receives a signal from the one or more antennas 1620, extracts information from the received signal, and provides the extracted information to the processing system 1614, specifically the reception component 1504. In addition, the transceiver 1610 receives information from the processing system 1614, specifically the transmission component 1514, and based on the received information, generates a signal to be applied to the one or more antennas 1620. The processing system 1614 includes a processor 1604 coupled to a computer-readable medium/memory 1606. The processor 1604 is responsible for general processing, including the execution of software stored on the computer-readable medium/memory 1606. The software, when executed by the processor 1604, causes the processing system 1614 to perform the various functions described supra for any particular apparatus. The computer-readable medium/memory 1606 may also be used for storing data that is manipulated by the processor 1604 when executing software. The processing system 1614 further includes at least one of the components 1504, 1506, 1508, 1510, 1512, 1514. The components may be software components running in the processor 1604, resident/stored in the computer readable medium/memory 1606, one or more hardware components coupled to the processor 1604, or some combination thereof. The processing system 1614 may be a component of the eNB 310 and may include the memory 376 and/or at least one of the TX processor 316, the RX processor 370, and the controller/processor 375.

In one configuration, the apparatus 1502/1502' for wireless communication may include means for determining indices associated with m consecutive elements. In an aspect, each of the m consecutive elements may be associated with a different index. In another aspect, each of the m consecutive elements may include at least in part k information bits. In another configuration, the apparatus 1502/1502' for wireless communication may include means for determining a permutation matrix. In a further configuration, the apparatus 1502/1502' for wireless communication may include means for permuting the k information bits. In one configuration, the apparatus 1502/1502' for wireless communication may include means for forming a vector by applying a reversed expansion matrix to the k information bits to include additional bits in bit-reversed predetermined locations. In an aspect, the vector may include N bits. In another configuration, the apparatus 1502/1502' for wireless communication may include means for applying a non-reversed encoding matrix after the permutation matrix is applied to the vector to obtain a signal for transmission. The aforementioned means may be one or more of the aforementioned components of the apparatus 1502 and/or the processing system 1614 of the apparatus 1502' configured to perform the functions recited by the aforementioned means. As described supra, the processing system 1614 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communication of a transmitter device, comprising:
   determining indices associated with m consecutive elements, wherein $m=2^k$ and k is a positive integer representing a number of information bits, and wherein each of the m consecutive elements are associated with a different index;
   bit reversing a binary sequence associated with each of the m consecutive elements, each of the m consecutive elements including a different binary sequence;
   determining, after bit reversing, a bit-reversed order of the indices based at least in part on the bit-reversed binary sequence associated with each of the m consecutive elements;
   writing each of the m consecutive elements to a different memory bank in parallel based at least in part on the bit-reversed order of the indices, the different memory bank for each of the m consecutive elements being selected based on a most significant log 2(m) bits associated with each of the m consecutive elements after the bit-reversed order of the indices is determined; and transmitting a signal that includes at least the m consecutive elements to a receiver device.

2. The method of claim 1, wherein each binary sequence associated with each of the m consecutive elements has different log 2(m) least significant bits, and wherein each of the m consecutive elements has different log 2(m) most significant bits after the binary sequence is bit-reversed.

3. The method of claim 1, wherein each of the m consecutive elements includes at least in part k information bits, the method further comprising:

forming a vector by applying an expansion matrix to the k information bits to include additional bits in predetermined locations, the vector including N bits.

4. The method of claim 3, wherein the bit reversing the binary sequence associated with each of the m consecutive elements comprises:

applying a bit-reversal permutation matrix to the vector.

5. The method of claim 4, further comprising:

applying a non-reversed encoding matrix to the vector to obtain the signal; or applying the bit-reversal permutation matrix after to the vector to obtain the signal.

6. A method of wireless communication of a receiver device, comprising:

receiving a signal from a transmitter device, the signal including at least in part m consecutive elements, wherein $m=2^k$ and k is a positive integer representing a number of information bits;

determining indices associated with each of the m consecutive elements, each of the m consecutive elements associated with a different index;

bit reversing a binary sequence associated with each of the m consecutive elements, each of the m consecutive elements include a different binary sequence;

determining, after bit reversing, a bit-reversed order of the indices based at least in part on the bit-reversed binary sequence associated with each of the m consecutive elements; and writing each of the m consecutive elements to a different memory bank in parallel based at least in part on the bit-reversed order of the indices, the different memory bank for each of the m consecutive elements being selected based on a most significant log 2(m) bits associated with each of the m consecutive elements after the bit-reversed order of the indices is determined.

7. The method of claim 6, wherein each binary sequence associated with each of the m consecutive elements has different log 2(m) least significant bits, and wherein each of the m consecutive elements has different log 2(m) most significant bits after the binary sequence is bit-reversed.

8. The method of claim 6, further comprising:

determining one or more log-likelihood ratios (LLRs) associated with the signal, the m consecutive elements including the one or more LLRs.

9. The method of claim 8, wherein the bit reversing the binary sequence associated with each of the m consecutive elements or with each of the one or more LLRs comprises:

applying a bit-reversal permutation matrix to the one or more LLRs.

10. An apparatus for wireless communication of a transmitter device, comprising:

means for determining indices associated with m consecutive elements, wherein $m=2^k$ and k is a positive integer representing a number of information bits, and wherein each of the m consecutive elements are associated with a different index;

means for bit reversing a binary sequence associated with each of the m consecutive elements, each of the m consecutive elements including a different binary sequence;

means for determining, after bit reversing, a bit-reversed order of the indices based at least in part on the bit-reversed binary sequence associated with each of the m consecutive elements;

means for writing each of the m consecutive elements to a different memory bank in parallel based at least in part on the bit-reversed order of the indices, the different memory bank for each of the m consecutive elements being selected based on a most significant log 2(m) bits associated with each of the m consecutive elements after the bit-reversed order of the indices is determined; and means for transmitting a signal that includes at least the m consecutive elements to a receiver device.

11. The apparatus of claim 10, wherein each binary sequence associated with each of the m consecutive elements has different log 2(m) least significant bits, and wherein each of the m consecutive elements has different log 2(m) most significant bits after the binary sequence is bit-reversed.

12. The apparatus of claim 10, wherein each of the m consecutive elements includes at least in part k information bits, the apparatus further comprising:

means for forming a vector by applying an expansion matrix to the k information bits to include additional bits in predetermined locations, the vector including N bits.

13. The apparatus of claim 12, wherein the means for bit reversing the binary sequence associated with each of the m consecutive elements is configured to:

apply a bit-reversal permutation matrix to the vector.

14. The apparatus of claim 13, further comprising:

means for applying a non-reversed encoding matrix to the vector to obtain a signal for transmission; or means for applying the bit-reversal permutation matrix after to the vector to obtain a signal for transmission.

15. An apparatus for wireless communication of a transmitter device, comprising:

at least one memory bank;

at least one processor coupled the at least one memory bank and configured to:

determine indices associated with m consecutive elements, wherein $m=2^k$ and k is a positive integer representing a number of information bits, and wherein each of the m consecutive elements are associated with a different index;

bit reverse a binary sequence associated with each of the m consecutive elements, each of the m consecutive elements including a different binary sequence;

determine, after bit reversing, a bit-reversed order of the indices based at least in part on the bit-reversed binary sequence associated with each of the m consecutive elements;

write each of the m consecutive elements to a different memory bank in parallel based at least in part on the bit-reversed order of the indices, the different memory bank for each of the m consecutive elements being selected based on a most significant $\log 2(m)$ bits associated with each of the m consecutive elements after the bit-reversed order of the indices is determined; and transmit a signal that includes at least the m consecutive elements to a receiver device.

16. The apparatus of claim 15, wherein each binary sequence associated with each of the m consecutive elements has different $\log 2(m)$ least significant bits, and wherein each of the m consecutive elements has different $\log 2(m)$ most significant bits after the binary sequence is bit-reversed.

17. The apparatus of claim 15, wherein each of the m consecutive elements includes at least in part k information bits, the at least one processor further configured to:

form a vector by applying an expansion matrix to the k information bits to include additional bits in predetermined locations, the vector including N bits.

18. The apparatus of claim 17, wherein the at least one processor is configured to bit reverse the binary sequence associated with each of the m consecutive elements by:

applying a bit-reversal permutation matrix to the vector.

19. The apparatus of claim 18, wherein the at least one processor is further configured to:

apply a non-reversed encoding matrix to the vector to obtain a signal for transmission; or apply the bit-reversal permutation matrix to the vector to obtain a signal for transmission.

* * * * *